US012677425B2

(12) United States Patent
Lin et al.

(10) Patent No.: US 12,677,425 B2
(45) Date of Patent: *Jul. 7, 2026

(54) 3D STACKABLE MEMORY AND METHODS OF MANUFACTURE

(71) Applicant: Taiwan Semiconductor Manufacturing Co., Ltd., Hsinchu (TW)

(72) Inventors: Meng-Han Lin, Hsinchu (TW); Chih-Yu Chang, New Taipei City (TW); Han-Jong Chia, Hsinchu (TW); Sai-Hooi Yeong, Zhubei City (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 137 days.

This patent is subject to a terminal disclaimer.

(21) Appl. No.: 18/637,552

(22) Filed: Apr. 17, 2024

(65) Prior Publication Data

US 2024/0268128 A1 Aug. 8, 2024

Related U.S. Application Data

(63) Continuation of application No. 18/343,912, filed on Jun. 29, 2023, now Pat. No. 11,991,888, which is a (Continued)

(51) Int. Cl.
*H10B 63/00* (2023.01)
*H10B 43/20* (2023.01)
(Continued)

(52) U.S. Cl.
CPC ............. *H10B 63/84* (2023.02); *H10B 43/20* (2023.02); *H10B 63/20* (2023.02); *H10B 63/30* (2023.02);
(Continued)

(58) Field of Classification Search
CPC ... H01L 21/02565; H10B 43/20; H10B 43/35; H10B 63/20; H10B 63/22; H10B 63/30;
(Continued)

(56) References Cited

U.S. PATENT DOCUMENTS 6,937,505 B2 8/2005 Morikawa
7,978,499 B2 7/2011 Hosono et al.
(Continued)

FOREIGN PATENT DOCUMENTS

CN 101359503 A 2/2009
CN 101727979 A 6/2010
(Continued)

*Primary Examiner* — Cheung Lee
(74) *Attorney, Agent, or Firm* — Slater Matsil, LLP

(57) ABSTRACT

Memory devices and methods of forming the memory devices are disclosed herein. The memory devices include a resistive memory array including a first resistive memory cell, a staircase contact structure adjacent the resistive memory array, and an inter-metal dielectric layer over the staircase contact structure. The memory devices further include a first diode and a second diode over the inter-metal dielectric layer. The memory devices further include a first conductive via electrically coupling the first diode to a first resistor of the first resistive memory cell and a second conductive via electrically coupling the second diode to a second resistor of the first resistive memory cell.

20 Claims, 19 Drawing Sheets

Related U.S. Application Data continuation of application No. 17/229,395, filed on Apr. 13, 2021, now Pat. No. 11,729,997.

(60) Provisional application No. 63/045,296, filed on Jun. 29, 2020.

(51) Int. Cl.

| | |
|---|---|
| *H10D 8/00* | (2025.01) |
| *H10D 30/67* | (2025.01) |
| *H10D 62/10* | (2025.01) |
| *H10D 62/80* | (2025.01) |
| *H10D 84/01* | (2025.01) |
| *H10D 84/03* | (2025.01) |
| *H10D 88/00* | (2025.01) |
| *H10D 99/00* | (2025.01) |
| *H10N 70/00* | (2023.01) |
| *H10P 14/20* | (2026.01) |
| *H10B 43/35* | (2023.01) |
| *H10N 70/20* | (2023.01) |

(52) U.S. Cl.

CPC ........... *H10D 8/00* (2025.01); *H10D 30/6735* (2025.01); *H10D 30/6757* (2025.01); *H10D 62/121* (2025.01); *H10D 62/80* (2025.01); *H10D 84/0149* (2025.01); *H10D 84/038* (2025.01); *H10D 88/00* (2025.01); *H10D 88/01* (2025.01); *H10D 99/00* (2025.01); *H10N 70/011* (2023.02); *H10P 14/3434* (2026.01); *H10B 43/35* (2023.02); *H10N 70/20* (2023.02)

(58) Field of Classification Search

CPC .......... H10B 63/80; H10B 63/84; H10D 8/00; H10D 8/20; H10D 30/501–509; H10D 30/6735; H10D 30/674; H10D 30/6755; H10D 30/6757; H10D 62/121; H10D 62/80; H10D 62/82; H10D 62/8271; H10D 62/8281; H10D 62/871; H10D 62/874; H10D 62/875; H10D 62/881–883; H10D 84/0149; H10D 84/038; H10D 88/00; H10D 88/01; H10D 99/00; H10N 70/011; H10N 70/20

See application file for complete search history.

(56) References Cited

U.S. PATENT DOCUMENTS

| | | | |
|---|---|---|---|
| 8,586,960 | B2 | 11/2013 | Happ et al. |
| 8,912,517 | B2 | 12/2014 | Van Buskirk |
| 9,379,163 | B1 | 6/2016 | Arayashiki |
| 9,577,009 | B1 | 2/2017 | Shih et al. |
| 10,157,962 | B2 | 12/2018 | Chen et al. |
| 10,593,375 | B2 | 3/2020 | Ishii |
| 2010/0091551 | A1 | 4/2010 | Hosono et al. |
| 2014/0084232 | A1 | 3/2014 | Van Buskirk |
| 2019/0013414 | A1 | 1/2019 | Shu et al. |
| 2020/0098982 | A1 | 3/2020 | Chuang et al. |
| 2020/0161373 | A1 | 5/2020 | Cheng et al. |
| 2020/0194455 | A1 | 6/2020 | Cho et al. |

FOREIGN PATENT DOCUMENTS

| | | | |
|---|---|---|---|
| CN | 102263041 | A | 11/2011 |
| CN | 106206940 | A | 12/2016 |
| CN | 110718569 | A | 1/2020 |
| CN | 110739012 | A | 1/2020 |
| CN | 110957422 | A | 4/2020 |
| CN | 110998731 | A | 4/2020 |
| CN | 111312747 | A | 6/2020 |
| DE | 102020123746 | A1 | 12/2021 |
| DE | 102020134374 | A1 | 12/2021 |
| DE | 102021111318 | A1 | 12/2021 |
| JP | 2010287872 | A | 12/2010 |
| KR | 20160141647 | A | 12/2016 |
| KR | 20200008606 | A | 1/2020 |
| KR | 20200037444 | A | 4/2020 |
| KR | 20200073702 | A | 6/2020 |
| TW | 200426839 | A | 12/2004 |
| TW | 201015546 | A | 4/2010 |
| TW | 201015714 | A | 4/2010 |
| TW | 201423744 | A | 6/2014 |
| TW | 201545279 | A | 12/2015 |
| TW | 201717317 | A | 5/2017 |
| TW | 201916024 | A | 4/2019 |

3D STACKABLE MEMORY AND METHODS OF MANUFACTURE

PRIORITY CLAIM AND CROSS-REFERENCE

This application is a continuation of U.S. patent application Ser. No. 18/343,912, filed on Jun. 29, 2023, now U.S. Pat. No. 11,991,888 issued May 21, 2024, which is a continuation of U.S. patent application Ser. No. 17/229,395, filed on Apr. 13, 2021, now U.S. Pat. No. 11,729,997 issued Aug. 15, 2023, which claims the benefit of U.S. Provisional Application No. 63/045,296, filed on Jun. 29, 2020, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
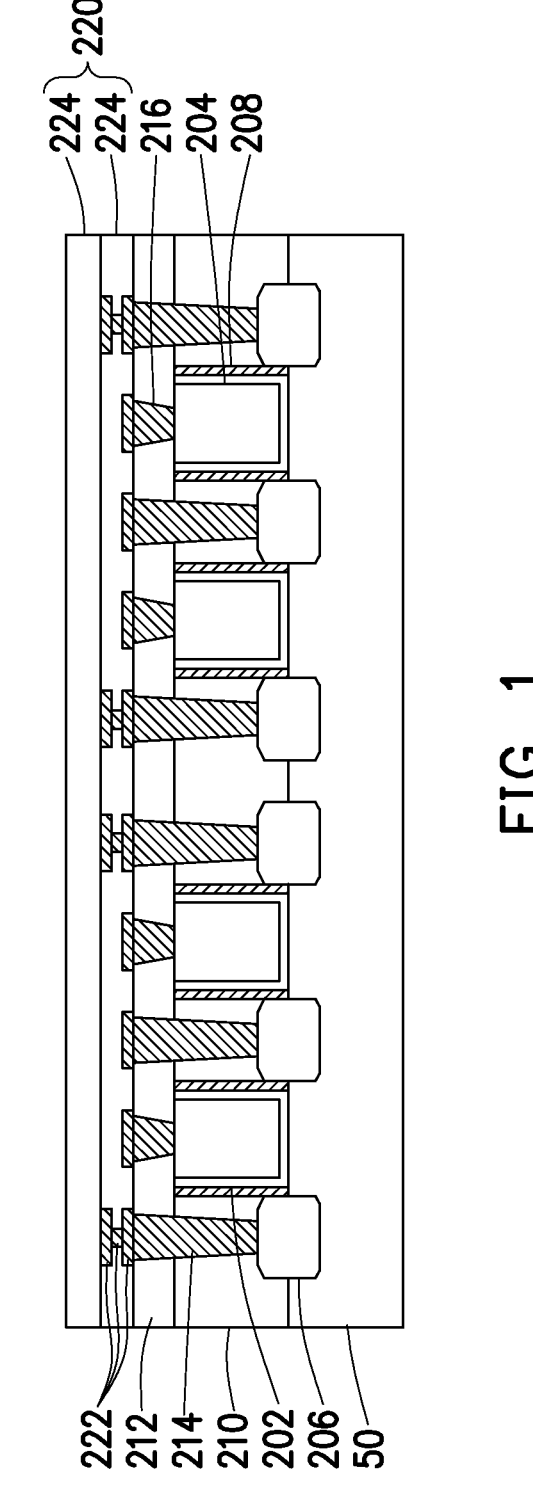
FIG. 1 illustrates a cross-sectional view of a device structure that may be formed over a substrate, according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure provide a 3-dimensional (3D) memory array (e.g., a RRAM memory array) that comprises a plurality of stacked memory cells (e.g., 1T2R memory cell) and that includes forming a first diode over and electrically connected to a first resistor of the memory cell and a second diode over and electrically connected to a second resistor of the memory cell. As such, the first diode and the second diode may be referred to herein as BEOL-compatible diodes. In addition, the 3D memory array and the staircase contact structure may be formed from a multi-layer stack of materials that is used in the fabrication process. The resulting 3D memory array may also have a reduced height and/or an increasing device density. Further, embodiments of the present disclosure provide for a memory cell (e.g., 1T2R) that prevents write disturb issues during write operations to a targeted resistor of the memory cell. For example, during write operations to a targeted resistor of the memory cell, leakage currents are prevented from passing through the bit line of the non-targeted resistor of the memory cell due to the diode that is electrically connected to the non-targeted resistor.

FIGS. 1 through 7 illustrate cross-sectional views of various intermediate steps of manufacturing a 3D memory array according to some embodiments. In FIG. 1, a device structure 103 is illustrated. The device structure 103 includes a substrate 50, which may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 1 further illustrates circuits of the device structure 103 that may be formed over the substrate 50. The circuits include active devices (e.g., transistors) at a top surface of the substrate 50. The transistors may include gate dielectric layers 202 over top surfaces of the substrate 50 and gate electrodes 204 over the gate dielectric layers 202. Source/drain regions 206 are disposed in the substrate 50 on opposite sides of the gate dielectric layers 202 and the gate electrodes 204. Gate spacers 208 are formed along sidewalls of the gate dielectric layers 202 and separate the source/drain regions 206 from the gate electrodes 204 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 206, the gate dielectric layers 202, and the gate electrodes 204 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 204. An interconnect structure 220, including one or more stacked dielectric layers 224 and conductive features 222 formed in the one or more stacked dielectric layers 224, is over the second ILD 212, the source/drain contacts 214, and the gate contacts 216. Although FIG. 1 illustrates two of the stacked dielectric layers 224, it should be appreciated that the interconnect structure 200 may include any number of stacked dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 1 discusses transistors formed over the substrate 50, other active devices (e.g., diodes or the like) and/or passive devices (e.g., capacitors, resistors, or the like) may also be formed as part of the functional circuits.

Figure 2:
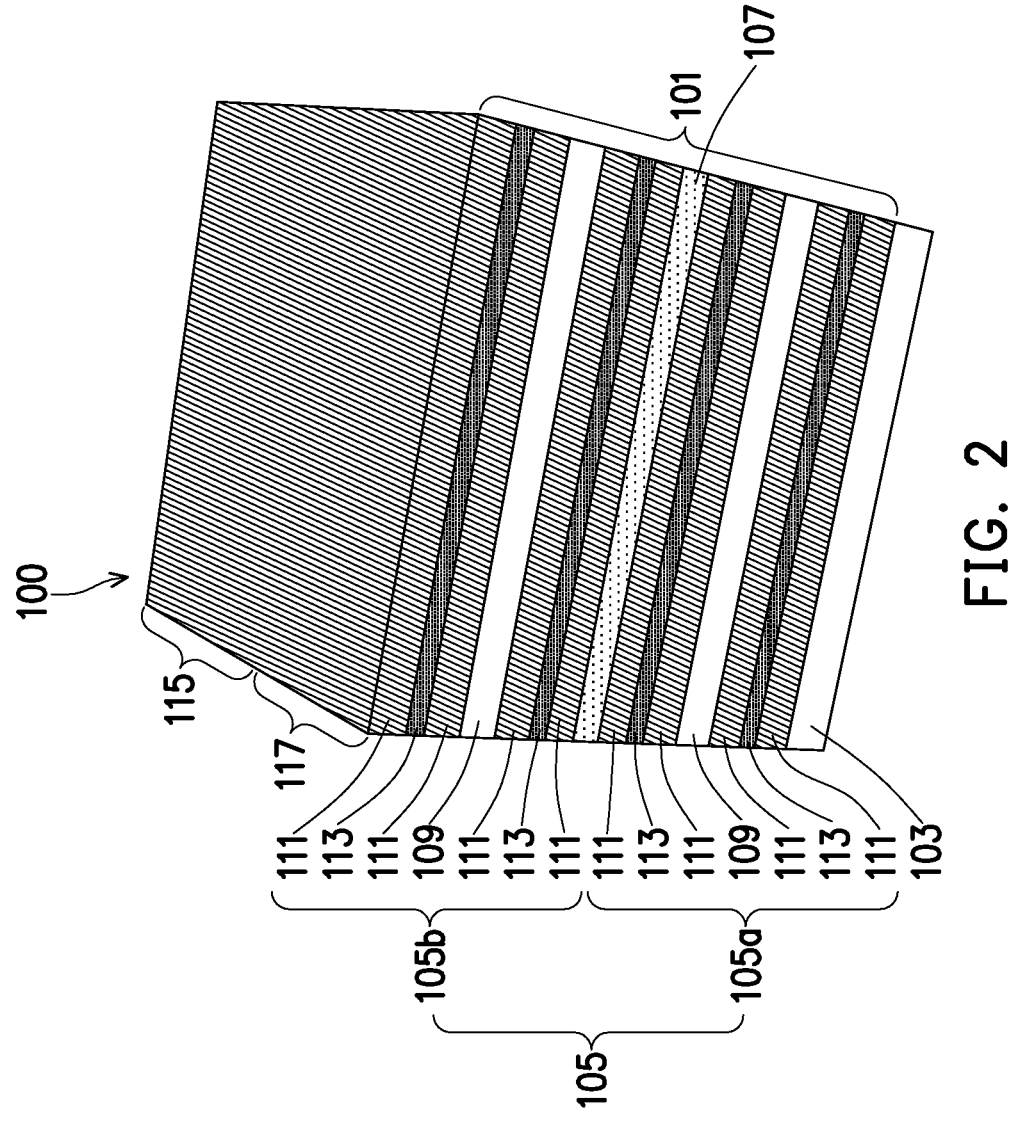
FIGS. 2-7 illustrate perspective, cross-sectional and top-views of intermediate stages in the manufacture of a 3D stackable resistive random access memory (RRAM) array, in accordance with embodiments.

In FIG. 2, a first multilayer stack 101 is formed over the device structure 103 of FIG. 1. The detailed features (e.g., substrate 50, the transistors, the ILDs, and the interconnect structure 120) of the device structure 103 may be omitted from subsequent drawings for the purposes of simplicity and clarity. Although the first multilayer stack 101 is illustrated as adjacent and in physical contact with the device structure 103, any number of intermediate layers may be disposed between the device structure 103 and the first multilayer stack 101. For example, one or more interconnect layers (e.g., redistribution structures) comprising conductive features in insulating layers (e.g., low-k dielectric layers) may be disposed between the device structure 103 and the first multilayer stack 101. In some embodiments, the conductive features may be patterned to provide power, ground, and/or signal lines for active devices embedded within the device structure 103.

As illustrated in FIG. 2, the first multilayer stack 101 comprises a first series 105a of material layers and a second series 105b of material layers stacked over the first series 105a of material layers, according to some embodiments. In some embodiments, the first series 105a of layers may be used in the eventual formation of a first circuit (e.g., a first resistive random-access memory (RRAM) cell) and the second series 105b may be used in the eventual formation of a second circuit (e.g., a second RRAM cell) stacked over the first circuit in an arrangement such as a 3D stacked RRAM device. Furthermore, the first multilayer stack 101 may be further used in the eventual formation of a first access transistor used to access the first circuit and a second access transistor used to access the second circuit. According to some embodiments, the first and second access transistors are formed as nanostructure field effect transistors (NSFETs) and are coupled to the first circuit and the second circuit in a shared access transistor configuration for a circuit design such as, a 1T2R 3D stacked RRAM device or the like.

Although embodiments of the first multilayer stack 101 are illustrated with two multilayer series (e.g., 105a and 105b) of material layers, it is appreciated that any suitable number of multilayer series of material layers may be formed in the first multilayer stack 101 depending on a desired design of a 3D stacked RRAM device. For example, the first multilayer stack 101 may be formed with more than two multilayer series 105 of material layers, such as three, four, or even more than four multilayer series 105 of material layers. Furthermore, the NSFET transistors may be formed as shared access transistors or the like. All such combinations of the first multilayer stack 101 and access transistors are within the scope of the embodiments.

According to some embodiments in which a 1T2R RRAM device is eventually to be formed, the first multilayer stack 101 is formed to comprise isolation layers 107, channel layers 109, metal line layers 111, and dielectric memory layers 113.

The first multilayer stack 101 may be formed by initially depositing a first layer of the metal line layers 111 over the device structure 103. The metal line layers 111 may comprise one or more layers, such as glue layers, barrier layers, diffusion layers, and fill layers, and the like and may be formed using metals and/or metal alloys such as aluminum (Al), titanium (Ti), titanium nitride (TiN), tantalum nitride (TaN), cobalt (Co), silver (Ag), gold (Au), copper (Cu), nickel (Ni), chromium (Cr), hafnium (Hf), ruthenium (Ru), tungsten (W), platinum (Pt), alloys thereof, or the like. In some embodiments, the metal line layers 111 include a glue layer and a conductive layer. The glue layer may be formed of a metal nitride (e.g., titanium nitride, tantalum nitride, zirconium nitride, hafnium nitride, or the like). The conductive layer may be formed of a metal (e.g., tungsten (W), titanium (Ti), titanium nitride (TiN), tantalum nitride (TaN), or the like). The material of the glue layer is one that has good adhesion to the material of the upper surface of the device structure 103 and the material of the conductive layer is one that has good adhesion to the material of the glue layer. The glue layer and conductive layer may each be formed by an acceptable deposition process such as atomic layer deposition, chemical vapor deposition, or the like. Once deposited, the materials of the metal line layers 111 may be planarized using an optional planarization process.

A first layer of the dielectric memory layers 113 may be formed over the metal line layer 111. The dielectric memory layers 113 may be formed as a conformal thin oxide film. According to some embodiments, the dielectric memory layers 113 may be formed using one or more layers of acceptable dielectric materials suitable for storing digital values, such as hafnium oxide ($HfO_2$); hafnium zirconium oxide ($Hf_{(1-x)}Zr_x\ O_2$); zirconium oxide ($ZrO_2$); titanium oxide ($TiO_2$); nickel oxide ($NiO$); tantalum oxides ($TaO_x$); copper oxide ($Cu_2O$); niobium pentoxide ($Nb_2O_5$); aluminum oxide ($Al_2O_3$); combinations thereof; or the like. The material of the dielectric memory layers 113 may be formed by an acceptable deposition process such as ALD, CVD, PVD, or the like. Once deposited, the materials of the dielectric memory layers 113 may be planarized using a process such as chemical mechanical planarization, an etch back process, combinations thereof, or the like.

Once the dielectric memory layer 113 has been formed, a second layer of the metal line layers 111 may be formed over the dielectric memory layer 113 using any of the layers, materials and processes that are suitable for forming the first layer of the metal line layers 111. In some embodiments, the second layer of the metal line layers 111 includes a glue layer and a conductive layer. The glue layer may be formed of a metal nitride that has good adhesion to the material of the dielectric memory layer 113 and the material of the conductive layer is one that has good adhesion to the material of the glue layer. Once the metal line layer 111 has been deposited, the optional planarization process may be performed to planarize the materials of the metal line layer 111.

Once the second layer of the metal line layers 111 has been formed, a first layer of the channel layers 109 may be formed over the metal line layer 111. According to some embodiments, the channel layer 109 may be formed by depositing a thin-film oxide semiconductor material (e.g., zinc oxide (ZnO), indium gallium zinc oxide (IGZO), indium tin oxide (ITO), indium tungsten oxide (IWO), poly-Si, a-Si, indium gallium zinc tin oxide (IGZTO), combinations thereof, or the like) using, for example, a deposition process such as, CVD, ALD, PVD, combinations thereof, or the like. However, any suitable materials and deposition processes may be utilized to form the channel layers 109. According to some embodiments, a material such as IGZO, IGZTO, or the like may be used to form the thin-film oxide semiconductor material as the first layer of the channel layers 109. Such materials may be used to form structurally sound features at low temperatures such as those temperatures used in a front-end of the line (FEOL) process. As such, the first layer of the channel layers 109 may be formed as a structurally sound layer of thin-film oxide semiconductor material in FEOL process for forming such channels layers 109.

Once the first layer of the channel layers 109 has been formed, a third layer of the metal line layers 111 may be formed over the dielectric memory layer 113 using any of the layers, materials and processes that are suitable for forming the first layer of the metal line layers 111. In some embodiments, the third layer of the metal line layers 111 includes a glue layer and a conductive layer. The glue layer may be formed of a metal nitride that has good adhesion to the material of the channel layers 109 and the material of the conductive layer is one that has good adhesion to the material of the glue layer. Once the metal line layer 111 has been deposited, the optional planarization process may be performed to planarize the materials of the metal line layer 111.

Once the third layer of the metal line layers 111 has been formed, a second layer of the dielectric memory layers 113 may be formed over the metal line layer 111 using any of the layers, materials and processes that are suitable for forming the first layer of the dielectric memory layers 113. In some embodiments, the second layer of the dielectric memory layers 113 may be formed as a conformal thin oxide film using a same oxide film material (e.g., zinc oxide (ZnO) as the first layer of the dielectric memory layers 113. In other embodiments, different oxide film materials may be used for the first layer and the second layer of the dielectric memory layers 113.

Once the second layer of the dielectric memory layers 113 has been formed, a fourth layer of the metal line layers 111 may be formed over the dielectric memory layer 113 using any of the layers, materials and processes that are suitable for forming the first layer of the metal line layers 111. In some embodiments, the fourth layer of the metal line layers 111 includes a glue layer and a conductive layer. The glue layer may be formed of a metal nitride that has good adhesion to the material of the dielectric memory layers 113 and the material of the conductive layer is one that has good adhesion to the material of the glue layer. Once the metal line layer 111 has been deposited, the optional planarization process may be performed to planarize the materials of the metal line layer 111. As such, a first series 105a of material layers has been formed.

Once the first series 105a of material layers has been formed, a first one of the isolation layers 107 may be deposited as a bulk layer (e.g., an oxide) over the first series 105a of material layers. The isolation layers 107 may be a dielectric material (e.g., silicon oxide ($SiO_2$), SiN, SiON, or the like). The isolation layers 107 may be formed using, for example, chemical vapor deposition (CVD), atomic layer deposition (ALD), physical vapor deposition (PVD), or the like. Once deposited, an optional anneal process (e.g., rapid thermal anneal, oxidation densification, or the like) and/or an optional planarization process (e.g., chemical mechanical planarization) may be performed to harden and/or planarize the isolation layers 107. In some embodiments, an optional layer of the isolation layers 107 is deposited over the device structure 103 prior to the formation of the first series 105a of material layers.

Once the isolation layer 107 has been formed over the first series 105a of material layers, the second series 105b of material layers may be formed over the first series 105a. The second series 105b of layers may be formed using any of the layers, materials, and processes suitable for forming the first series 105a of layers. In some embodiments, the second series 105b of layers comprises the same material layers and ordering of layers as the first series 105a, although the material layers and ordering of layers may also be different. In the illustrated embodiment, the second series 105b comprises the same material layers and the same ordering of layers as the first series 105a.

In some embodiments, further series of material layers may be formed in the first multilayer stack 101 in a stacked fashion one over the other until a desired topmost series of material layers has been formed. Any suitable number of the series of material layers may be formed in the first multilayer stack 101. In the illustrated embodiment, the first multilayer stack 101 comprises two series of material layers, the first series 105*a* of layers and the second series 105*b* of layers stacked over the first series 105*a* of layers.

FIG. 2 further illustrates a first region 115 of the first multilayer stack 101. The first region 115 may be designated for forming a 3D stacked memory array, according to some embodiments. In addition, a second region 117 of the first multilayer stack 101 is adjacent the first region 115 and may be designated for forming a staircase contact structure for external connection to the 3D stacked memory array.

Figure 3:
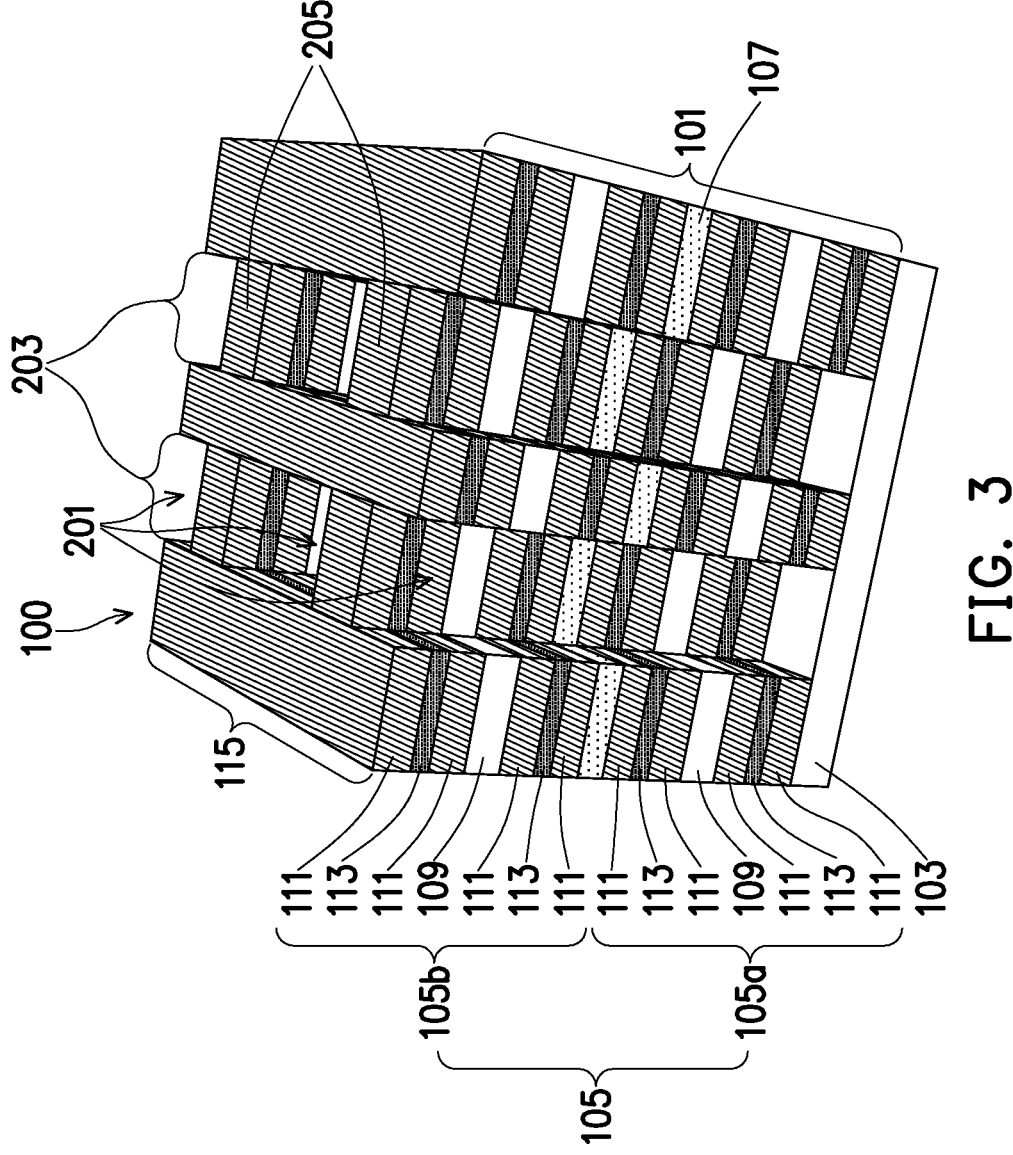

FIG. 3 illustrates the formation of gate trenches 201 within wordline regions 203 of the first multilayer stack 101, according to some embodiments. The wordline region 203 may also be referred to herein as a word line region. The gate trenches 201 may be formed by initially forming a photoresist (not shown) over the first multilayer stack 101. The photoresist may be formed using a spin-on technique and can be patterned using acceptable photolithography techniques. The photoresist may be patterned to expose the surface of the topmost layer of the first multilayer stack 101 in desired locations of the gate trenches 201. The gate trenches 201 may be patterned using one or more photolithography processes, including double-patterning or multipatterning processes.

According to some embodiments, a first etch chemical that is selective to a topmost exposed layer of first multilayer series 105 of material layers and relatively non-selective to a layer of first multilayer series 105 underlying the topmost exposed layer may be used to form the gate trenches 201 through the topmost exposed layer of first multilayer series 105 and stopping on the layer of first multilayer series 105 underlying the topmost exposed layer may be used. As such, the layer of first multilayer series 105 underlying the topmost exposed layer becomes the next topmost exposed layer of first multilayer series 105 of material layers. A second etch chemical that is selective to the next topmost exposed layer of first multilayer series 105 and relatively nonselective to the layer of first multilayer series 105 underlying the next topmost exposed layer. As such, the layer of first multilayer series 105 underlying the next topmost exposed layer becomes the next topmost exposed layer of first multilayer series 105. This process may be continued using suitable etch chemicals to remove the next topmost exposed layer of first multilayer series 105 and stopping on the layer of first multilayer series 105 underlying the next topmost exposed layer of first multilayer series 105 until the gate trenches 201 have been etched through the first multilayer stack 101 and stopping on the topmost layer of the device structure 103. For example, a chlorine or fluorine-based gas such as chlorine ($Cl_2$) or hydrogen fluoride (HF), or the like, may be used to selectively etch the material of the channel layers 109 (e.g., ZnO) without substantively removing the dielectric material of the isolation layers 107 (e.g., $SiO_2$) of first multilayer series 105. The isolation layers 107 may be selectively etched using a wet etch chemical that comprises phosphorus, (e.g., $H_3PO_4$, or the like) without substantively removing the material of the channel layers 109 and/or the metal line layers 111 (e.g., Ti). In other embodiments, a single etching process may be used to remove all materials of the series of material layers and stopping on the topmost layer of the device structure 103, such as with an etching process that is selective to all of the materials of the first multilayer stack 101 and/or using a timed etching process.

According to some embodiments, timed etch processes may be used to stop the etching of the gate trenches 201 after the trenches have reach a desired depth. For example, the timed etch process may be timed to stop at the surface of the device structure 103, although the timed etch process may be timed to etch into the device structure 103 to a desired depth. According to some embodiments, an optional contact etch stop layer (not shown) may be provided at an interface between the device structure 103 and the first multilayer stack 101. The optional contact etch stop layer may comprise a dielectric material, such as, silicon nitride, silicon oxide, silicon oxynitride, or the like, having a different etch rate than the materials of an overlying layer of the first multilayer stack 101. In such embodiments, the optional contact etch stop layer is formed via a suitable deposition process (e.g., atomic layer deposition, chemical vapor deposition, physical vapor deposition, or the like) over the device structure 103 prior to the formation of the first multilayer stack 101 and the first multilayer stack 101 is formed over the optional contact etch stop layer. Furthermore, an additional etch process may be used to remove materials of the optional contact etch stop layer such that the device structure 103 is exposed at the bottom of the gate trenches 201.

Once patterned, the remaining portions of the first multilayer stack 101 between the gate trenches 201 form a plurality of strips 205. As such, the gate trenches 201 are separated by the strips 205. Although the embodiment illustrated in FIG. 3 shows each of the strips 205 having the same width, widths of the strips 205 of one 3D stacked memory array located in one region of the first multilayer stack 101 may be greater or thinner than the strips 205 of another 3D stacked memory array located in another region of the first multilayer stack 101. According to some embodiments, each of the gate trenches 201 may have a consistent width throughout. In other embodiments, the gate trenches 201 and thus the strips 205 may have tapered sidewalls such that a width of each of the strips 205 continuously increases in a direction towards the substrate 50. In such embodiments, each of the layers of the first multilayer stack 101 may have a different width in a direction perpendicular to the sidewalls of the strips 205. In addition, the gate trenches 201 may also be extended into the second region 117 (shown in FIG. 2) dividing the second region 117 into separate regions for the eventual formation of a staircase contact structure as is described below with regard to FIG. 8.

Figure 4:
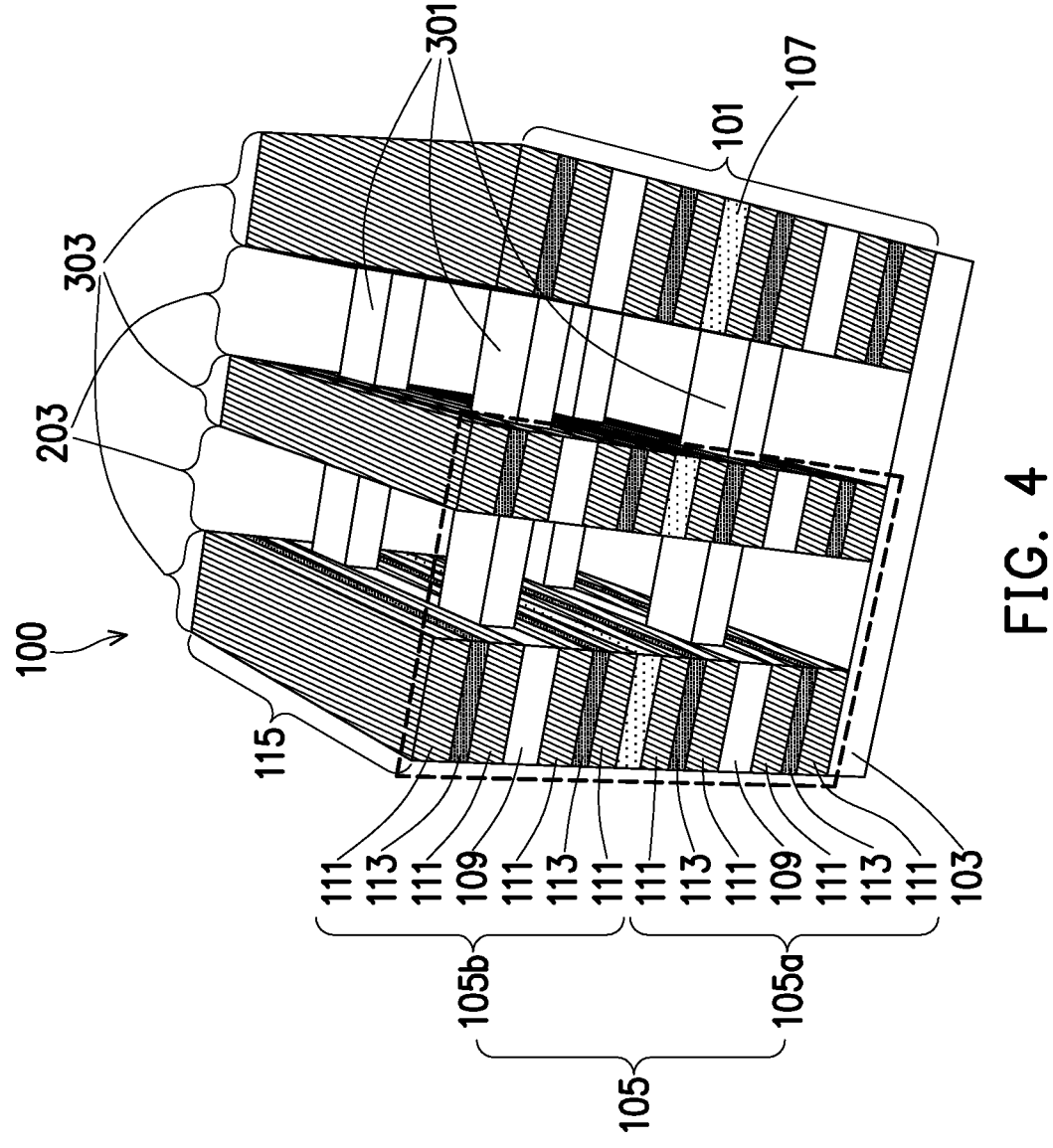

FIG. 4 illustrates a wire-release process for forming nanostructures 301 from the channel layers 109. Once the gate trenches 201 have been formed, according to some embodiments, the spacers and/or photoresist used to form the gate trenches 201 (shown in FIG. 2) may be removed and a mask layer (not shown) for use in the wire-release process may be formed over the first multilayer stack 101 and patterned to expose the wordline regions 203. In other embodiments, the spacers and/or photoresist layer used to form the gate trenches 201 may be retained and the mask layer for use in the wire-release process is formed over the spacers and the photoresist layer. In such embodiments, the mask layer may be formed over the photoresist and/or the spacers and then patterned to expose the portions of the photoresist and/or the spacers covering the gate trenches 201 and/or the strips 205 (shown in FIG. 2) within the wordline regions 203.

According to some embodiments, the mask layer may be a conductive or non-conductive material and may be selected from a group including silicon nitride, silicon oxynitride, amorphous silicon, polycrystalline-silicon (polysilicon), poly-crystalline silicon-germanium (poly-SiGe), metallic nitrides, metallic silicides, metallic oxides, and metals. The mask layer may be deposited by physical vapor deposition (PVD), CVD, ALD, sputter deposition, or other techniques for depositing the selected material. Once the material of the mask layer has been deposited, the material may be patterned using, e.g., a photolithographic masking and etching process. Once the mask layer is patterned, the exposed portions of the photoresist and/or the spacers are removed using one or more suitable removal processes (e.g., ashing, selective etching, combinations thereof, or the like).

Once the mask layer has been formed and patterned, the sidewalls of the gate trenches 201 and thus the sidewalls of the strips 205 as illustrated in FIG. 4 are exposed. As such, the material of the first multilayer stack 101 of the strips 205 may be removed from between the channel layers 109 and removed from between the device structure 103 and the channel layers 109 in a wire release process step. As such, the remaining material of strips 205 (e.g., the channel layers 109) form the nanostructures 301 between source/bit line regions 303 of the first multilayer stack 101. The nanostructures 301 may also be referred to herein as wires, nanowires, sheets, and/or nanosheets. In an embodiment the materials of the strips 205 to be removed are removed using a wet etching process that selectively removes those materials without significantly removing the material of the channel layers 109 within the wordline regions 203 and without significantly removing any of the materials within the source/bit line regions 303 of the first multilayer stack 101. However, any other suitable removal process may be utilized.

For example, in an embodiment, an etch chemical containing phosphorous (e.g., $H_3PO_4$) may be used to selectively remove the other materials of the first multilayer stack 101 without substantively removing the material of the semiconductor channel regions (e.g., zinc oxide (ZnO)) and/or the material of the device structure 103. However, in other embodiments any other suitable etchant may be utilized to selectively remove any of the other materials of the first multilayer stack 101 without substantively removing the material of the channel layers 109 (e.g., zinc oxide (ZnO)) and/or the material of the device structure 103.

By removing the other materials of the first multilayer stack 101, the sides of the nanostructures 301 are exposed and separated from each other within the wordline regions 203. The nanostructures 301 form a channel structure between opposite ones of the source/bit line regions 303. In some embodiments, a tuning selectivity of the etching process is used to form the nanostructures 301 and may be adjusted such that the nanostructures 301 are formed with smooth surfaces or comprising a plurality of faceted surfaces. As such, the nanostructures 301 may be formed with different profile shapes (e.g., round, square, rectangle, hexagon, octagon, or the like). In the illustrated embodiment the nanostructures 301 are formed to have a square profile with the channel width being about the same as the original thicknesses of the nanostructures 301, although the etching processes may also be utilized to reduce these thicknesses.

Once the nanostructures 301 have been formed, any remaining portions of the mask layer, the retained spacers and/or the retained photoresist may be removed using one or more suitable removal processes (e.g., wet etch, dry etch, or the like) that utilize one or more etchants that are selective to the materials of the mask layer, the retained spacers and/or the retained photoresist. However, any suitable removal process may be utilized.

Figure 5:
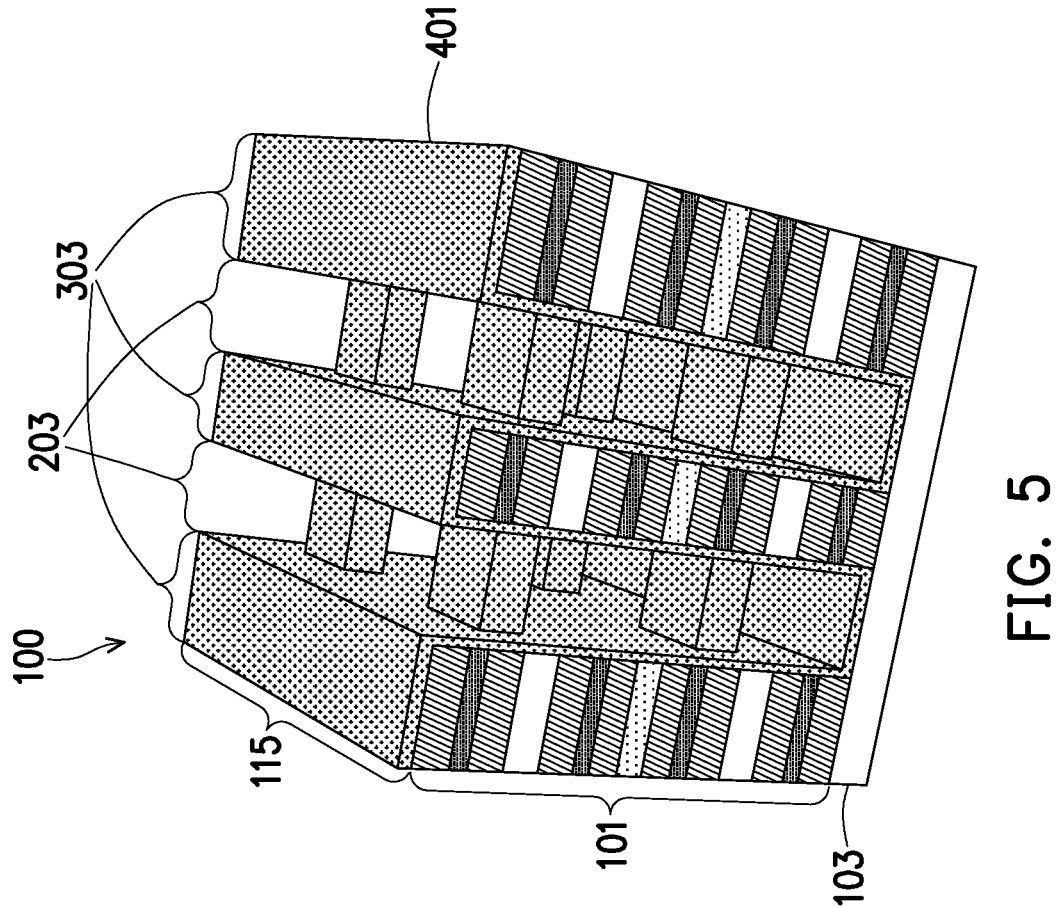

FIG. 5 illustrates the formation of the gate dielectric material 401 on sidewalls of the source/bit line regions 303 in the wordline regions 203 of the first multilayer stack 101, and on exposed surfaces of the nanostructures 301 between sidewalls of the source/bit line regions 303 within the wordline regions 203 of the first multilayer stack 101. The gate dielectric material 401 is formed as a conformal thin film. According to some embodiments, the gate dielectric material 401 may be formed using one or more layers of acceptable dielectric materials suitable for storing digital values, such as multilayer dielectrics (e.g., oxide-nitride-oxide (ONO), nitride-oxide-nitride (NON), or the like); other dielectrics (e.g., silicon oxynitride (SiON), silicon nitride (SiN), or the like); ferro-electric (FE) materials such as, hafnium zirconium oxide (HfZrO); zirconium oxide (ZrO); undoped hafnium oxide (HfO); doped hafnium oxides (e.g., HfLaO using lanthanum (La) as a dopant, HfSiO using silicon (Si) as a dopant, HfAlO using aluminum (Al) as a dopant, or the like); combinations thereof; or the like. The material of the gate dielectric material 401 may be formed by an acceptable deposition process such as ALD, CVD, PVD, or the like.

Figure 6:
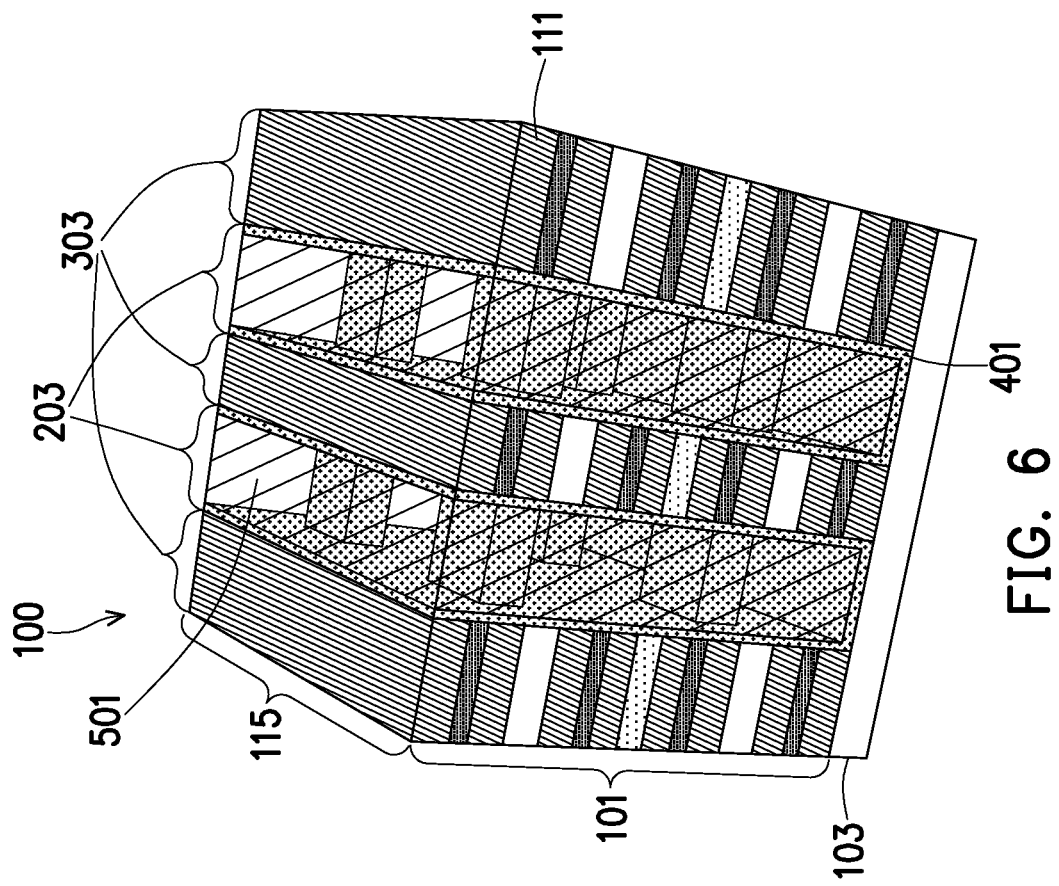

FIG. 6 illustrates the formation of wrap-around word line structures 501 formed over the gate dielectric material 401 within the wordline regions 203 of the first multilayer stack 101. Once the gate dielectric material 401 has been deposited, a planarization process (e.g., chemical mechanical planarization (CMP)) may be performed to remove the gate dielectric material 401 at the top of the first multilayer stack 101. As such, the metal line layers 111 may be exposed for further processing. The wrap-around word line structures 501 may comprise one or more layers, such as glue layers, barrier layers, diffusion layers, and fill layers, and the like. In some embodiments, the wrap-around word line structures 501 includes a glue layer and a conductive layer. The glue layer may be formed of metal nitride, such as titanium nitride, tantalum nitride, zirconium nitride, hafnium nitride, or the like. The conductive layer may be formed of a metal such as tungsten, cobalt, aluminum, nickel, copper, silver, gold, alloys thereof, or the like. The material of the glue layer is one that has good adhesion to the material of gate dielectric material 401 and the material of the conductive layer is one that has good adhesion to the material of the glue layer. In embodiments where the gate dielectric material 401 is formed of an oxide such as oxide-nitride-oxide (ONO) film, the glue layer can be titanium nitride and the conductive layer can be tungsten. The glue layer and conductive layer may each be formed by an acceptable deposition process such as ALD, CVD, PVD, or the like. The materials of the wrap-around word line structures 501 may fill and overfill the remaining opening in the wordline regions 203 and may be formed over the top surfaces of the first multilayer stack 101 outside of the wordline regions 203. The conductive layer fills the remaining area of the gate trenches 201. Once deposited, the materials of the wrap-around word line structures 501 and the gate dielectric material 401 may be planarized with the topmost layer of the first multilayer stack 101 using a process such as chemical mechanical planarization, an etch back process, combinations thereof, or the like.

Figure 7:
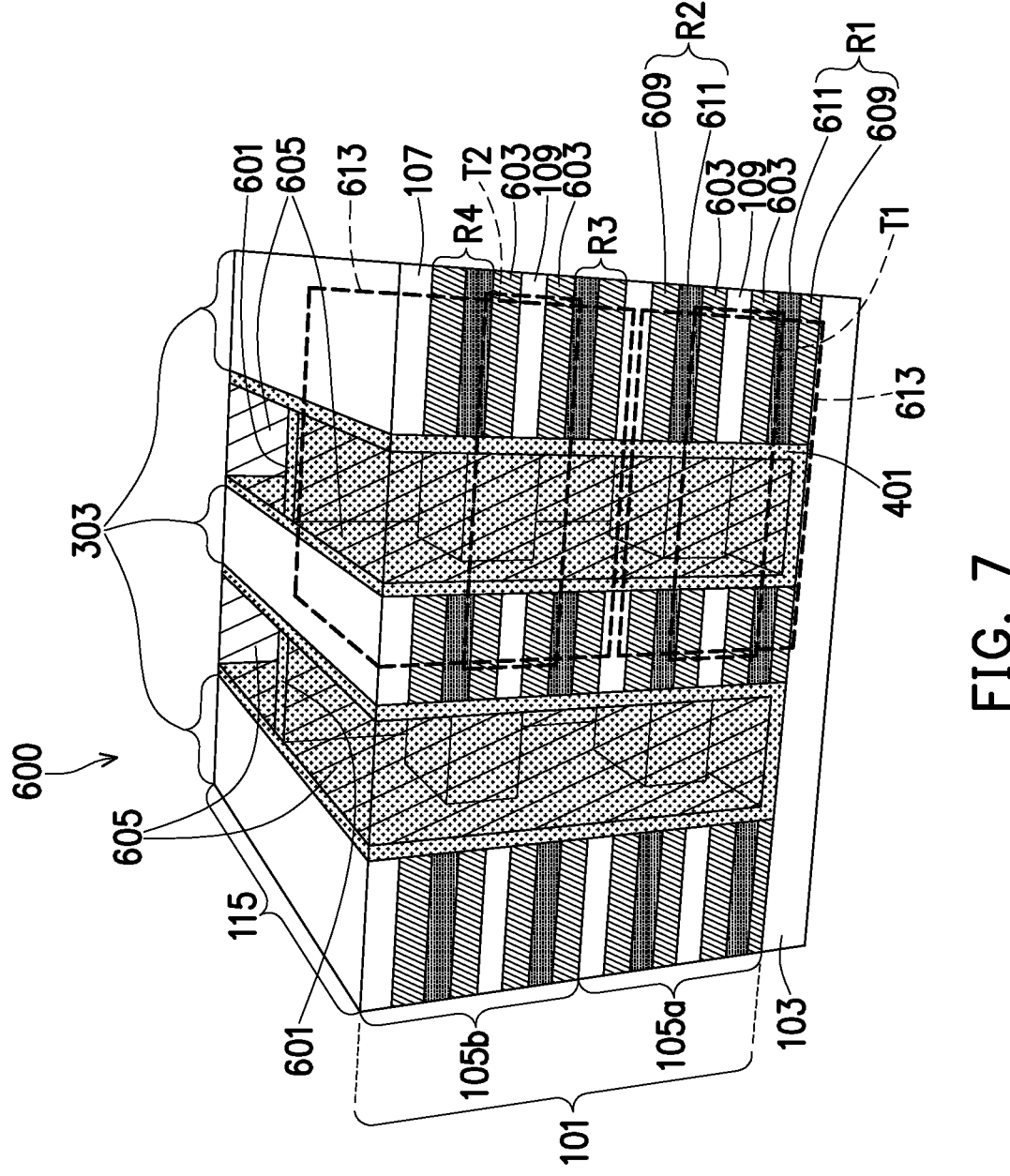

Turning to FIG. 7, this figure illustrates the formation of a 3D stacked memory array 600 from the structure illustrated in FIG. 6, according to some embodiments. The 3D stacked memory array 600 comprises a plurality of first stacked memory cells 613 (e.g., 1T2R memory cells). In the illustrated embodiment, each of the first stacked memory cells 613 comprises a transistor (e.g., first transistor T1, second transistor T2), and two resistors (e.g., first resistor R1, second resistor R2) for which a values may be set/reset during write operations. For example, when a write voltage ($V_W$) is placed on the metal source/bit line 603 adjacent to the first resistor R1 and a word line voltage ($V_{WL}$) is placed on the wrap-around gate 605 of the first transistor T1, a write operation may be performed to set/reset a value stored for the first resistor R1. Similarly, a write operation may be performed to set/reset a value stored for the second resistor R2 by placing the write voltage ($V_W$) on the metal source/bit line 603 adjacent to the second resistor R2 and placing the word line voltage ($V_{WL}$) on the wrap-around gate 605 of the first transistor T1. Similar write operations may be made with regard to the second transistor T2, the third resistor R3, and the fourth resistor R4. Although embodiments of the memory array 600 have been described using e.g., 1T2R configuration, other embodiments e.g., 2T2R configuration (not shown) may also be utilized. Instead of one common transistor with two resistors (e.g., 1T2R), in the 2T2R configuration, each memory cell 613 may be formed with two transistors and two resistors (e.g., R1 and R2). The two transistors of the 2T2R configuration may be formed with independent channel regions 109 separated by an optional layer (not shown) of the isolation layers 107. As such, the two transistors of the 2T2R configuration may operate independently from one another with one of the two resistors (e.g., R1 and R2) during write operations.

In addition, the 3D stacked memory array 600 may be formed with a staircase contact structure and BEOL compatible diodes in the eventual formation of a 3D memory device, as discussed in detail below. As such, a robust design is provided for the stacked memory cells 613 which prevents write disturb issues from occurring during write operations to the resistors. Further details of operation for the stacked memory cells 613 are provided below in relation to an equivalent circuit design of the memory circuit 1200. The isolation layers 107 isolate the stacked memory cells 613 from one another. Furthermore, the gate isolation plugs 601 isolate the wrap-around gates 605 of neighboring stacks of the first stacked memory cells from one another. The wrap-around gates 605 and the gate isolation plugs 601 may be formed by initially forming word line gaps through the wrap-around word line structures 501 (shown in FIG. 6), in accordance with some embodiments. The word line gaps may be formed using any of the photolithography and etching techniques suitable for etching the materials of the wrap-around word line structures 501. The etching may be anisotropic. In some embodiments, the word line gaps can be formed by a series of appropriate etches (e.g., dry etches and/or wet etches). According to some embodiments, a dry etch is performed using a fluorine-based gas (e.g., $C_4F_6$) mixed with hydrogen ($H_2$) or oxygen ($O_2$) gas to remove the conductive layer of the wrap-around word line structures 501 and a wet etch is performed using a nitric acid ($HNO_3$) and hydrofluoric acid (HF) solution to remove the glue layer of the wrap-around word line structures 501. However, other suitable removal processes may be utilized to remove the materials from the word line gaps. As such, the wrap-around word line structures 501 are separated by the word line gaps into individual structures of the wrap-around gates 605.

Once the word line gaps have been formed through the wrap-around word line structures 501, the gate isolation plugs 601 may be formed using any of the acceptable dielectric materials and/or deposition processes used to form the gate dielectric material 401. For example, the gate isolation plugs 601 may be formed using a dielectric material (e.g., silicon oxide) and an acceptable deposition process (e.g., ALD) to fill and/or overfill the word line gaps, respectively. Once filled and/or overfilled, the gate isolation plugs 601 may be planarized (e.g., via CMP) to remove excess materials of the gate isolation plugs 601 outside of the word line gaps and to remove excess materials of the gate dielectric material 401 over the top of the first multilayer stack 101. As such, the tops of the gate isolation plugs 601, the gate dielectric material 401 and the wrap-around gates 605 are coplanar with a top of the first multilayer stack 101 and the separate structures of the wrap-around gates 605 are isolated from one another by the gate isolation plugs 601. The nanostructures 301 (shown in FIG. 4) of the first transistor T1 and the second transistor T2 are formed from the channel layers 109 and are surrounded by the gate dielectric material 401 as described above. The wrap-around gate 605 surrounds the channel regions of the first transistor T1 and the second transistor T2 and is separated from the nanostructures 301 by the gate dielectric material 401. The metal source/bit lines 603 of the first transistor T1 and the second transistor T2 are formed from the metal line layers 111 during the wire-release process described above. The gate dielectric material 401 isolates the wrap-around gate 605 from the sidewalls of the channel layers 109 and the metal source/bit lines 603. The gate dielectric material 401 further isolates the wrap-around gate 605 from the sidewalls of the first resistor R1 and the second resistor R2.

In the illustrated embodiment, the first resistor R1 is coupled to the metal source/bit lines 603 on a first side of the first transistor T1. The second resistor R2 is coupled to the metal source/bit lines 603 on a second side of the first transistor T1. Each of the first resistors R1 and the second resistors R2 comprises a resistive memory film 611 and a top electrode 609. The resistive memory films 611 are formed from the dielectric memory layer 113 during the wire-release process described above. The resistive memory films 611 are coupled to the metal source/bit lines 603 on opposite sides of the first transistor T1, respectively. The top electrodes 609 are formed from the metal line layers 111 during the wire-release process described above. Each of the top electrodes 609 are coupled to the resistive memory films 611 of the first resistor R1 and second resistor R2, respectively. Resistive memory films 611 may have at least two states, a high-resistance state and a low-resistance state which may correspond to two logic states, namely set and reset states. The state of resistive memory films 611 may be determined by applying a voltage to the resistive memory films 611, and determining the current flowing through the resistive memory films 611 (e.g., determining whether the resistive memory films 611 is in a high or low-resistance state to read a corresponding bit stored by the resistive memory films 611). In the illustrated embodiment, the resistive memory films 611 of the first resistor R1 is coupled to the metal source/bit lines 603 on one side of the channel layers 109 of the first transistor T1 and the resistive memory films 611 of the second resistor R2 is coupled to the metal source/bit lines 603 on the other side of the channel layers 109 of the first transistor T1. As such, the first transistor T1 may be a shared access transistor for activating read/write operations for either of the first resistor R1 and the second resistor R2.

In the illustrated embodiment of FIG. 7, a second stacked memory cell 613 is formed from the second series 105b of material layers and is stacked over the first stacked memory cells 613 formed from the first series 105a of material layers. In the illustrated embodiment, each of the second stacked memory cells 613 comprises a second transistor T2 and two resistors (e.g., third resistor R3 and fourth resistor R4). The resistive memory films 611 of the third resistor R3 is coupled to the metal source/bit lines 603 on one side of the channel layer 109 of the second transistor T2 and the resistive memory films 611 of the fourth resistor R4 is coupled to the metal source/bit lines 603 on the other side of the channel layer 109 of the second transistor T2. As such, the second transistor T2 may be a shared access transistor for activating read/write operations for either of the third resistor R3 and the fourth resistor R4. In the illustrated embodiment, the gate dielectric material 401 isolates the wrap-around gate 605 from the sidewalls of the multilayer stack 101 in the source/bit line regions 303. Furthermore, the gate isolation plugs 601 isolate the wrap-around gates 605 of neighboring stacks of the second stacked memory cells 613.

Figure 8:
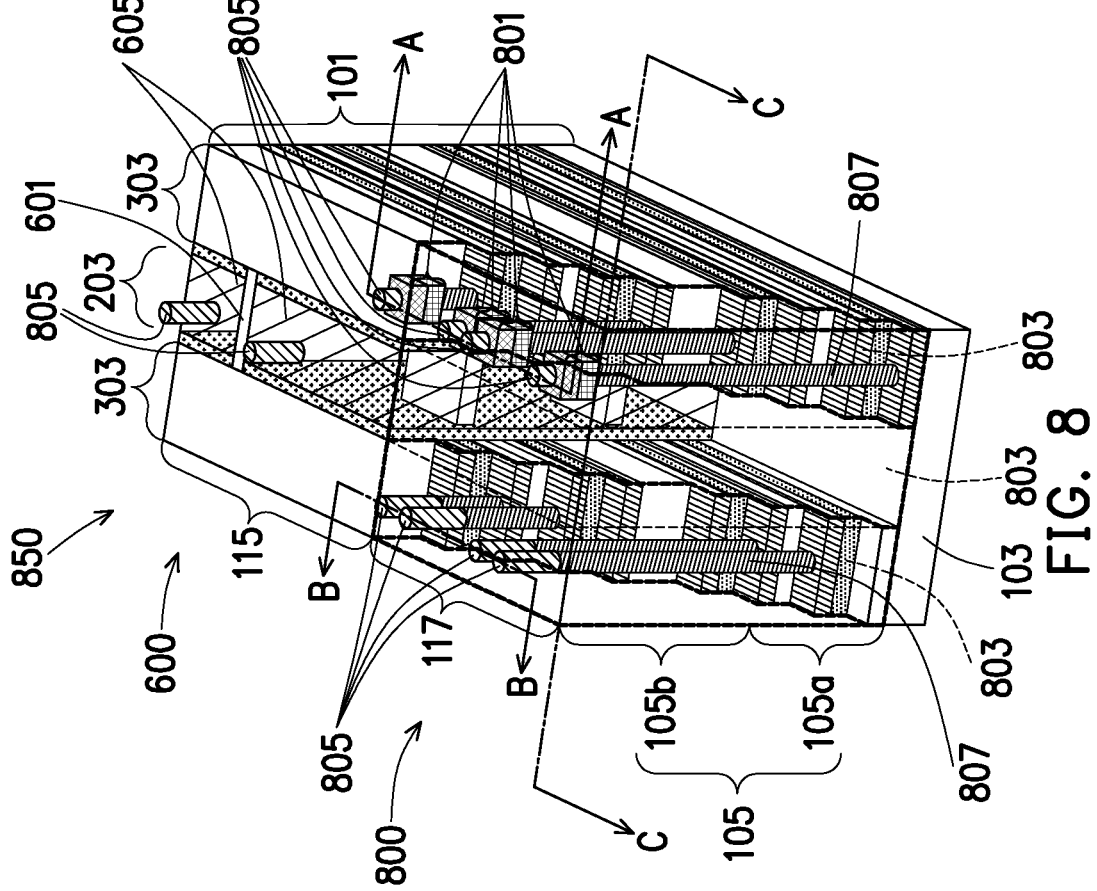
FIG. 8 illustrates a perspective view of a 3D memory device incorporating the 3D stackable RRAM array and a first staircase contact structure, in accordance with some embodiments.

FIG. 8 is a perspective view of a second 3D memory device 850 comprising a staircase contact structure 800 adjacent the second 3D stacked memory array 600, according to some embodiments. In particular, FIG. 8 illustrates the formation of the staircase contact structure 800 in the second region 117 of the second multilayer stack 101 adjacent the second 3D stacked memory array 600 formed within the first region 115 of the second multilayer stack 101, according to some embodiments. Although the illustrated embodiment is directed towards the formation of the staircase contact structure 800 in the second region 117 of the second multilayer stack 101, it is understood and would be appreciated that a staircase structure of similar design may be suitably formed within the second region 117 of the second multilayer stack 101 adjacent the 3D stacked memory array 600. All such combinations of staircase structures and memory arrays are within the scope of the embodiments.

FIG. 8 further illustrates the formation of a first intermetal dielectric (IMD) layer 803 over the staircase contact structure 800. The first IMD layer 803 is formed within the gate trenches 201 extending into the second region 117 of the second multilayer stack 101 and over the exposed surfaces of the staircase contact structure 800. In addition, FIG. 8 illustrates diodes 801 formed over the first IMD layer 803, conductive contacts 805 formed over the diodes 801 and wrap-around gates 605, and conductive through inter-layer vias (TIVs) 807 electrically coupling the diodes 801 and the conductive contacts 805 to the staircase contact structure 800.

According to some embodiments, the portion of the staircase contact structure 800 associated with the first cutline A-A in FIG. 8 provides contact to the bit lines of the transistors formed within the second 3D stacked memory array 600. As such, the portion of the staircase contact structure 800 associated with the first cutline A-A may be referred to herein as a bit line staircase portion, BL staircase portion, bit line staircase, BL staircase, or the like. Furthermore, in the illustrated embodiment, the portion of the staircase contact structure 800 associated with the second cutline B-B in FIG. 8 provides contact to the source lines of the transistors formed within the second 3D stacked memory array 600. As such, the portion of the staircase contact structure 800 associated with the second cutline B-B may be referred to herein as a source line staircase portion, SL staircase portion, source line staircase, SL staircase, or the like.

Figure 9:
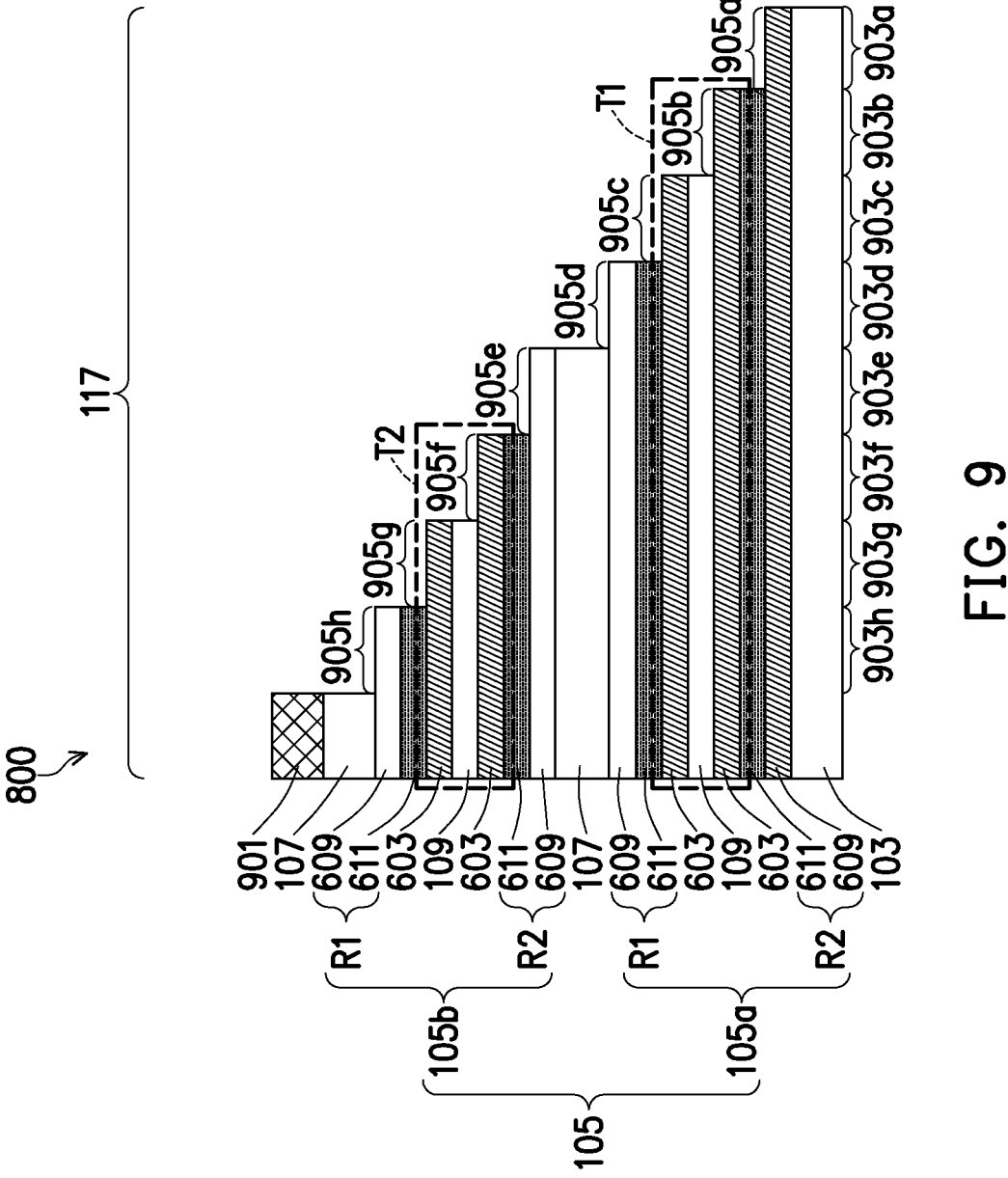
FIGS. 9, 10A and 10B illustrate cross-sectional views of intermediate steps in forming the first staircase contact structure, in accordance with some embodiments.

FIG. 9 illustrates a cross-sectional view of the staircase contact structure 800 along a first cutline A-A of FIG. 8. In the illustrated embodiment, the staircase contact structure 800 is formed so that a portion of the metal source/bit lines 603 and a portion of the top electrodes 609 of each of the second multilayer series 105 are exposed. The staircase contact structure 800 may be formed by a plurality of etching processes, where each of the etching processes is performed by using a different etching mask (e.g., a patterned photoresist) to expose a different portion of the second 3D memory device 850 for removal, and by etching for a different duration to achieve different etching depth, as an example. The second 3D stacked memory array 600 may remain protected by the etching mask during the etching of the formation of the staircase contact structure 800.

As illustrated in FIG. 9, a portion of each of the second multilayer series 105 laterally distal from the second 3D stacked memory array 600 is removed to form the staircase contact structure 800. The areas of the removed portion of the second multilayer series 105 increases along a vertical direction away from the device structure 103. For example, the higher (further away from the device structure 103) the metal source/bit lines 603 and/or the top electrodes 609 are within the second multilayer series 105 the more area of the overlying layers within the second multilayer series 105 are removed to expose portions of the metal source/bit lines 603 and/or the top electrodes 609.

The staircase contact structure 800 may be formed by initially placing a photoresist 901 over the second multilayer stack 101 after the formation of the second 3D stacked memory array 600. The photoresist 901 can be formed by using a spin-on technique and can be patterned using acceptable photolithography techniques. Patterning the photoresist 901 may expose a portion of the second multilayer stack 101 in the second region 117 while masking remaining portions of the second multilayer stack 101. Once the photoresist 901 has been patterned, one or more layers of the second multilayer stack 101 in the exposed portion (e.g., first staircase region 903a) may be removed using a suitable staircase etching process for the materials being removed. The staircase etching process may be any acceptable etch process, such as by wet or dry etching, a reactive ion etch (RIE), neutral beam etch (NBE), the like, or a combination thereof. The etching may be anisotropic.

According to some embodiments, the etching may remove portions of one or more material layers of the second multilayer stack 101 that are exposed in the first staircase region 903a and may stop on a material layer underlying the one or more material layers being removed. In some embodiments, a recursive etching process may be used such that the photoresist 901 is patterned to expose a first desired portion of the topmost layer of the isolation layers 107 (e.g., first staircase region 903a) and the patterned photoresist 901 is then used as a mask in a step of the recursive etching process to transfer its pattern into the topmost layer of the isolation layers 107. Once transferred, portions of the second multilayer stack 101 are exposed and the topmost layer of the isolation layers 107 may be used as a hard mask in another step of the recursive etching process to transfer the pattern of the hard mask into one or more layers of the second multilayer stack 101. Once transferred, portions of an underlying layer of the second multilayer stack 101 are exposed in the staircase contact structure 800.

In some embodiments, a layer of the second multilayer stack 101 may be used as an etch stop layer to control the removal of the materials during individual etching steps of the recursive etching process. In some embodiments, the etching process may be a timed process to control the removal of the materials during the etching process. All such etching processes and all such combinations of such etching processes may be used to form the staircase contact structure 800 and are within the scope of the embodiments.

Once the first staircase region 903a has been exposed, the exposed portions of the second multilayer stack 101 in the first staircase region 903a are etched in a staircase etching process using the photoresist 901 as a mask. One or more etching steps may be performed in the first staircase region 903a until a desired layer has been exposed. Once the desired layer of the second multilayer stack 101 has been exposed, the photoresist 901 may be trimmed to expose another portion of the second multilayer stack 101 in a second staircase region 903b while masking remaining portions of the second multilayer stack 101 outside of the second staircase region 903b. The exposed portions of the second multilayer stack 101 in the second staircase region 903b may be etched by repeating the staircase etching process using the trimmed photoresist as a mask.

The trimming of the photoresist 901 and the staircase etching process may be repeated until a desired number of staircase contact areas 905 have been exposed. In the illustrated embodiment, eight of the staircase contact areas (e.g., 905a, 905B, 905c, 905d, 905e, 905f, 905g, and 905h) are exposed with the last trimming of the photoresist 901 exposing the eighth staircase contact area 905h. However, more or fewer of the staircase contact areas 905 may be formed based on a desired structure for a 3D memory device. For example in a second multilayer stack 101 comprising a lesser number of metal source/bit lines 603 and/or the top electrodes 609 (e.g., four), fewer of the staircase contact areas 905 (e.g., four) may be formed. As another example in a second multilayer stack 101 comprising a greater number of metal source/bit lines 603 and/or the top electrodes 609 (e.g., nine, ten, eleven, twelve, . . . etc.), more staircase contact areas 905 (e.g., nine, ten, eleven, twelve, . . . etc.) may be formed. The staircase contact structure 800 may be formed with any suitable number of staircase contact areas 905.

Figure 10A:
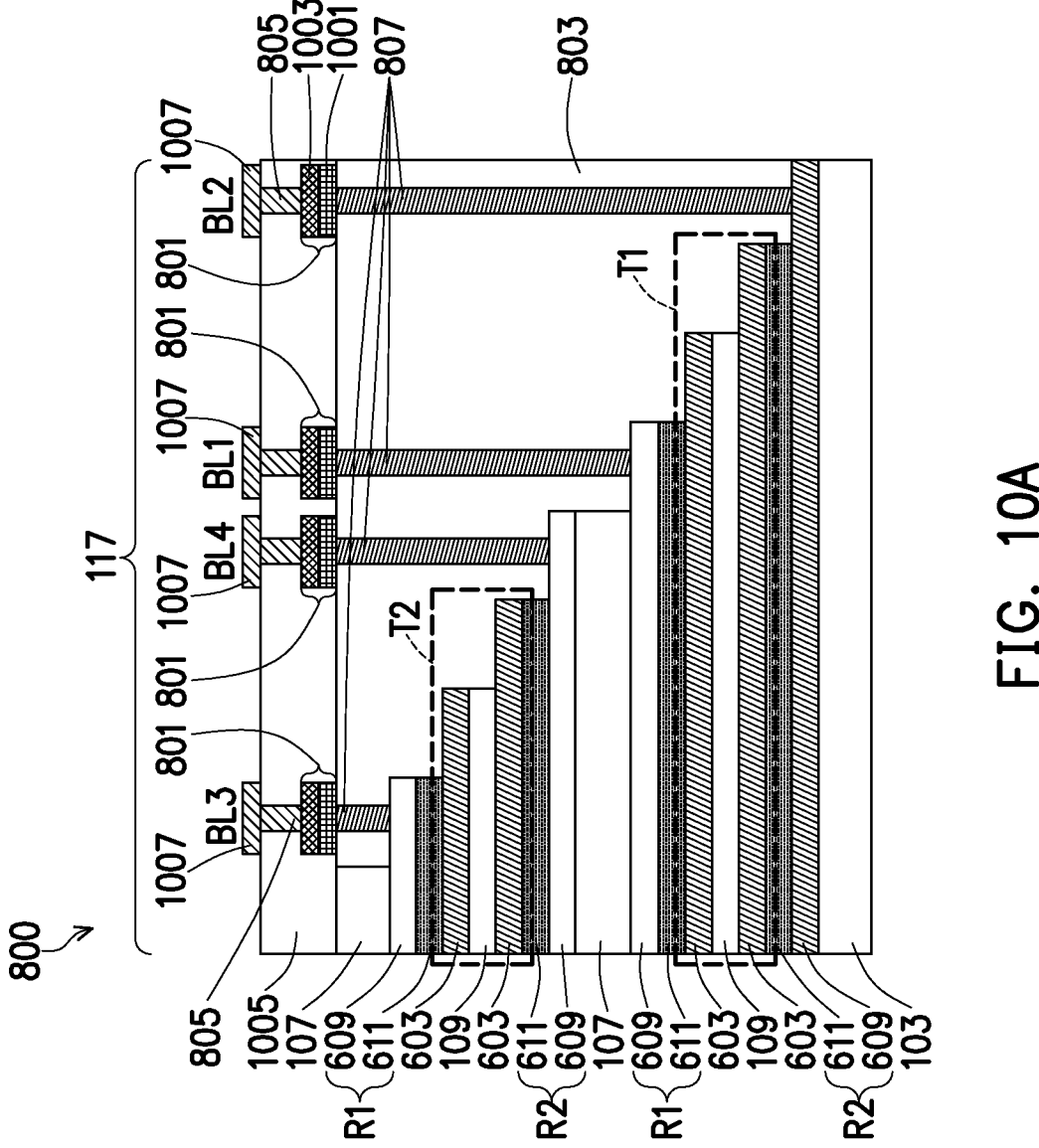

Continuing to FIG. 10A, once the staircase contact structure 800 has been formed, the first IMD layer 803 is formed over the staircase contact structure 800. In some embodiments, prior to forming the first IMD layer 803, the staircase contact structure 800 is separated into the bit line staircase portion and the source line staircase portion as is illustrated in FIG. 7. In such embodiments, the first IMD layer 803 fills the staircase trench and isolates the bit line staircase portion from the source line staircase portion.

According to some embodiments, the first IMD layer 803 is formed using, e.g., silicon oxide, silicon nitride, or the like, and is formed by a suitable method such as CVD, PVD, ALD, or the like. Once formed, the first IMD layer 803 is then planarized according to some embodiments with the co-planar surfaces of the isolation layers 107, gate dielectric material 401, the gate isolation plugs 601, and the wrap-around gate 605 in the first region 115 of the second multilayer stack 101. The first IMD layer 803 may be planarized using a process such as chemical mechanical planarization (CMP). The photoresist 901 may be removed prior to the planarization of the first IMD layer 803 using, e.g., an ashing process. In some embodiments, the photoresist 901 may be removed during the planarization of the first IMD layer 803 using the CMP process, the ashing process, combinations thereof, or the like.

FIG. 10A further illustrates the formation of the conductive TIVs 807 through the bit line staircase portion of the staircase contact structure 800, according to some embodiments. In the illustrated embodiment, the conductive TIVs 807 are formed over the staircase contact areas 905 of the top electrodes 609 (e.g., 905a, 905d, 905e, and 905h as shown in FIG. 9). The conductive TIVs 807 are also formed through the first IMD layer 803, according to some embodiments. The conductive TIVs 807, shown in FIG. 10A, provide external connectivity to the top electrodes 609 of the bit line staircase structure of the second 3D stacked memory array 600.

In an embodiment in which the conductive TIVs 807 are conductive pillars (e.g., tungsten, copper, aluminum, titanium, alloys, combinations thereof, or the like), the conductive TIVs 807 may be formed by initially forming the first IMD layer 803 over the first region 115 and the second region 117 of the second multilayer stack 101. Once formed, the first IMD layer 803 is patterned using suitable photolithographic and etching processes to form openings through the first IMD layer 803 and expose areas of the staircase contact areas 905 in desired locations of the conductive TIVs 807. Once the openings have been formed, the openings may be filled and/or overfilled with a conductive fill material (e.g., W, Al, Cu, or the like) using a suitable deposition process (e.g., chemical vapor deposition (CVD), physical vapor deposition (PVD), or the like). Once deposited, a planarization process may be performed to planarize the top surfaces of the conductive TIVs 807 to be co-planar with a surface of the first IMD layer 803.

FIG. 10A further illustrates the formation of the diodes 801 from a first conductive type oxide semiconductor layer 1001 and a second conductive type oxide semiconductor layer 1003, according to some embodiments. The diodes 801 may be formed by initially depositing a bulk layer of a first conductive type oxide semiconductor layer 1001 to a desired thickness over the co-planar surfaces of the first IMD layer 803 and the conductive TIVs 807. Suitable oxide materials may be used for the first conductive type oxide semiconductor layer 1001 include materials such as zinc oxide (ZnO), indium gallium zinc oxide (IGZO), indium tungsten oxide (IWO), indium tin oxide (ITO), indium gallium zinc tin oxide (IGZTO), or the like and may be formed using, for example, chemical vapor deposition (CVD), atomic layer deposition (ALD), physical vapor deposition (PVD), or the like. The first conductive type oxide semiconductor layer 1001 may be doped using any suitable doping process (e.g., in situ during epitaxial growth, implantation after deposition, combinations thereof, or the like) to have a first conductive type (e.g., p-type, n-type, $p^+$-type, or the like). In embodiments in which the first conductive type is a p-type, the first conductive type oxide semiconductor layer 1001 may be doped using a dopant such as boron hydride (e.g., diborane $B_2H_6$). However, any suitable materials, deposition processes, dopants and/or doping processes may be utilized to form the first conductive type oxide semiconductor layer 1001. In embodiments in which the first conductive type is an n-type, the first conductive type oxide semiconductor layer 1001 may be doped using a dopant such as phosphane ($PH_3$). However, any suitable materials, deposition processes, dopants and/or doping processes may be utilized to form the first conductive type oxide semiconductor layer 1001.

Once deposited, the first conductive type oxide semiconductor layer 1001 is planarized using, e.g., CMP. As such, the first conductive type oxide semiconductor layer 1001 is formed over and electrically coupled to the conductive TIVs 807 through the first IMD layer 803 to the top electrodes 609 of the bit line staircase structure.

The second conductive type oxide semiconductor layer 1003 may be formed by depositing a bulk layer of a second oxide semiconductor material to a desired thickness over the first conductive type oxide semiconductor layer 1001. The second conductive type oxide semiconductor layer 1003 may be formed using any of the oxide materials and processes suitable for forming the first conductive type oxide semiconductor layer 1001. The second oxide semiconductor material may be formed using the same oxide materials as the first oxide semiconductor material, although different oxide materials may also be used. However, the second oxide semiconductor material is formed counter-doped to the material of the first conductive type oxide semiconductor layer 1001. For example, in embodiments which the first conductive type oxide semiconductor layer 1001 is doped using p-type or p⁺-type dopants, the second conductive type oxide semiconductor layer 1003 is doped to have a second conductive type (e.g., n-type). In other embodiments which the first conductive type oxide semiconductor layer 1001 is doped using n-type dopants, the second conductive type oxide semiconductor layer 1003 is doped to have the second conductive type (e.g., p-type or p+-type). Once deposited, the second conductive type oxide semiconductor layer 1003 is planarized using, e.g., CMP. As such, the second conductive type oxide semiconductor layer 1003 is formed over and electrically coupled to the first conductive type oxide semiconductor layer 1001.

Once formed, the first conductive type oxide semiconductor layer 1001 and the second conductive type oxide semiconductor layer 1003 are then patterned using suitable photolithographic and etching processes to form the diodes 801. The diodes 801 are formed in their desired locations over the conductive TIVs 807 of the bit line staircase contact structure. As such, the formation of the diodes 801 is compatible with back-end of the line (BEOL) processes.

FIG. 10A further illustrates the formation of a first set of the conductive contacts 805 for external connectivity to the diodes 801, according to some embodiments. The conductive contacts 805 may be formed by initially depositing a second IMD layer 1005 over the surface of the first IMD layer 803 and the diodes 801. In some embodiments, the second IMD layer 1005 may also be formed over co-planar surface of the isolation layers 107, gate dielectric material 401, gate isolation plugs 601, and the wrap-around gate 605 in the first region 115 of the second multilayer stack 101. The second IMD layer 1005 may serve as a protection layer in the first region 115 during further processing of the staircase contact structure 800 in the second multilayer stack 101. In other embodiments, a separate protection layer (not shown) is formed over the first region 115 prior to forming the second IMD layer 1005. The second IMD layer 1005 may be formed using any of the materials and processes suitable for forming the first IMD layer 803. Once formed, the second IMD layer 1005 is patterned using suitable photolithographic and etching processes to form openings through the second IMD layer 1005 in the desired locations of the conductive contacts 805. As such, the diodes 801 are exposed through the openings in the second IMD layer 1005.

FIG. 10A further illustrates the formation of conductive contacts 805 for connectivity to the diodes 801, in accordance with some embodiments. In some embodiments, an optional silicidation process uses appropriate materials such as titanium, nickel, cobalt, or erbium in order to reduce the Schottky barrier height of the conductive contacts 805. However, other metals, such as platinum, palladium, and the like, may also be used for the optional silicidation process. In some embodiments, the optional silicidation process is performed using a blanket deposition of an appropriate metal layer in the openings and over the exposed areas of the diodes 801. The blanket deposition is followed by an annealing step which causes the metal layer to react with the underlying exposed second oxide semiconductor material (e.g., ZnO) of the diodes 801. Un-reacted metal is then removed, such as with a selective etch process. In other embodiments, the optional silicidation process is omitted.

The conductive contacts 805 may be formed by depositing a conductive material such as W, Al, Cu, Co, Ti, Ta, Ru, TiN, TiAl, TiAlN, TaN, TaC, NiSi, CoSi, combinations of these, or the like, into the openings and over the exposed areas of the diodes 801 or over the optional silicide contacts (if present). The conductive material may be deposited using a process such as sputtering, chemical vapor deposition, electroplating, electroless plating, or the like, to fill and/or overfill the openings. Once filled or overfilled, any conductive material deposited outside of the openings may be removed using a planarization process such as chemical mechanical polishing (CMP). However, any suitable deposition process and planarization process may be utilized.

Once the first set of conductive contacts 805 have been formed to the diodes 801, bit lines 1007 may be formed over the conductive contacts 805. FIG. 10A also designates the first set of conductive contacts 805 as a first bit line BL1 and a second bit line BL2 associated with the first access transistor T1 and a third bit line BL3 and a fourth bit line BL4 associated with the second access transistor T2 of the second 3D stacked memory array 600. The conductive contacts 805 form external connection between the bit lines 1007 of the second 3D stacked memory array 600 and underlying active devices and/or signal, power, and ground lines in the device structure 103.

Figure 10B:
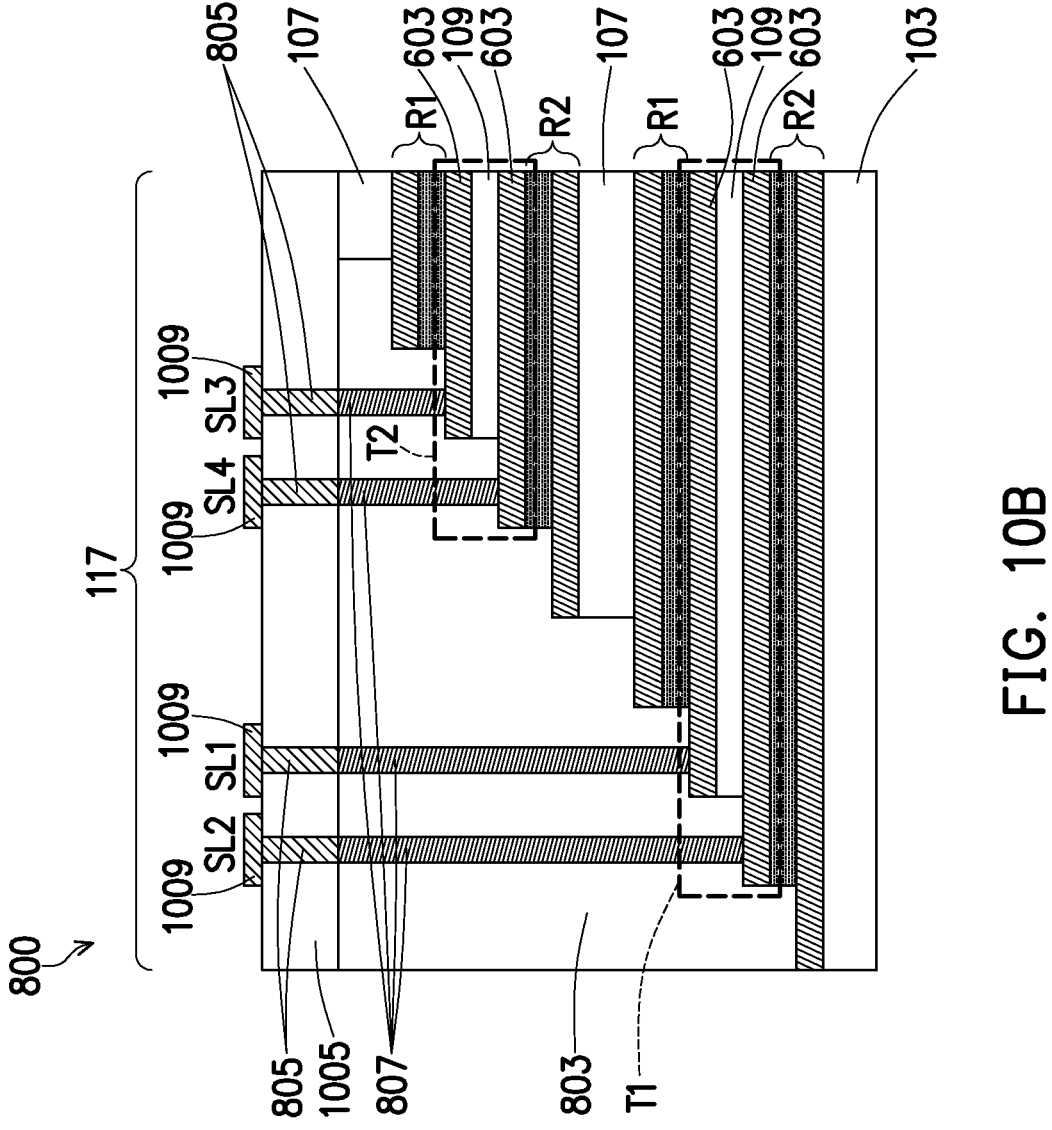

Turning to FIG. 10B, this figure illustrates the formation of a second set of the conductive TIVs 807 through the source line staircase portion of the staircase contact structure 800, according to some embodiments. The second set of conductive TIVs 807 provide external connectivity to the metal source/bit lines 603 in the source line staircase structure associated with the second 3D stacked memory array 600. In the illustrated embodiment, the second set of the conductive TIVs 807 are formed over the staircase contact areas 905 of the metal source/bit lines 603 (e.g., 905b, 905c, 905f, and 905g as shown in FIG. 8) in the source line staircase portion. The second set of the conductive TIVs 807 may be formed using any of the materials and processes for forming the first set of the conductive TIVs 807 in the bit line staircase portion described above. The second set of the conductive TIVs 807 may be formed during the process for forming the first set of the conductive TIVs 807, although they may also be formed in different process steps.

FIG. 10B further illustrates the formation of a second set of the conductive contacts 805 for connectivity to the second set of the conductive TIVs 807, in accordance with some embodiments. The second set of the conductive contacts 805 may be formed by initially forming openings through the second IMD layer 1005 and exposing the second set of the conductive TIVs 807 in the desired locations of the second set of the conductive contacts 805. The openings for the second set of the conductive contacts 805 may be formed during the process of forming the openings for the first set of the conductive contacts 805. The second set of the conductive contacts 805 may be formed using any of the materials and processes suitable for forming the first set of the conductive contacts 805. The second set of the conductive contacts 805 are formed by depositing a conductive material into the openings and over the exposed areas of the second set of the conductive TIVs 807 or over the optional silicide contacts (if present) and then planarized. However, any suitable deposition process and planarization process may be utilized.

Once the second set of conductive contacts 805 have been formed to the conductive TIVs 807 in the source line portion of the staircase contact structure 800, source lines 1009 may be formed over the conductive contacts 805. FIG. 10B also designates each of the source lines 1009 as a first source line SL1 and a second source line SL2 associated with the first access transistor T1 and a third source line SL3 and a fourth source line SL4 associated with the second access transistor T2 in the second 3D stacked memory array 600. The second set of conductive contacts 805 form external connection between the source lines 1009 of the second 3D stacked memory array 600 and underlying active devices and/or signal, power, and ground lines in the device structure 103.

In addition, a third set of the conductive contacts 805 may also be formed to the wrap-around gates 605 (shown in FIG. 8). In embodiments in which the second IMD layer 1005 is formed over the first region 115, openings for the third set of the conductive contacts 805 may be formed in the first region 115 and the third set of the conductive contacts 805 may be formed to the wrap-around gates 605 during the process of forming the second set of conductive contacts 805 to the conductive TIVs 807 and/or the first set of conductive contacts 805 to the diodes 801. As such, the third set of conductive contacts 805 may use the same materials and techniques used to form the other sets of conductive contacts 805. However, the third set of conductive contacts 805 may also be formed in separate processing steps from those used to form the other sets of conductive contacts 805 and may be formed using different materials and/or techniques from those used to form the other conductive contacts 805. In some embodiments, the third set of conductive contacts 805 may be formed using materials and/or techniques suitable for forming the third set of conductive contacts 805 to the wrap-around gates 605. Once the third set of conductive contacts 805 have been formed to the wrap-around gates 605 of the second 3D stacked memory array 600, word lines 1101 (shown in FIG. 11) may be formed over the third set of the conductive contacts 805 using any of the materials and processes suitable for forming the source lines 1009 and/or the bit lines 1007. The third set of conductive contacts 805 provide external connection between the word lines 1101 of the second 3D stacked memory array 600 and underlying active devices and/or signal, power, and ground lines in the semiconductor die.

Further interlayer dielectric layers (not individually illustrated) and other conductive features (also not individually illustrated) may be formed over the conductive contacts 805, the source lines 1009, the bit lines 1007, and/or the word lines 1101 to provide further external connectivity to the second 3D memory device 850. Examples of further conductive features include but are not limited to, conductive vias, contact plugs, redistribution layers, contact traces, integrated passive devices, under bump metallization layers, integrated fan-out devices, interposers, and external contacts. However, any suitable dielectric layers and/or conductive features may be utilized and all such features are fully intended to be included within the scope of the embodiments.

Figure 11:
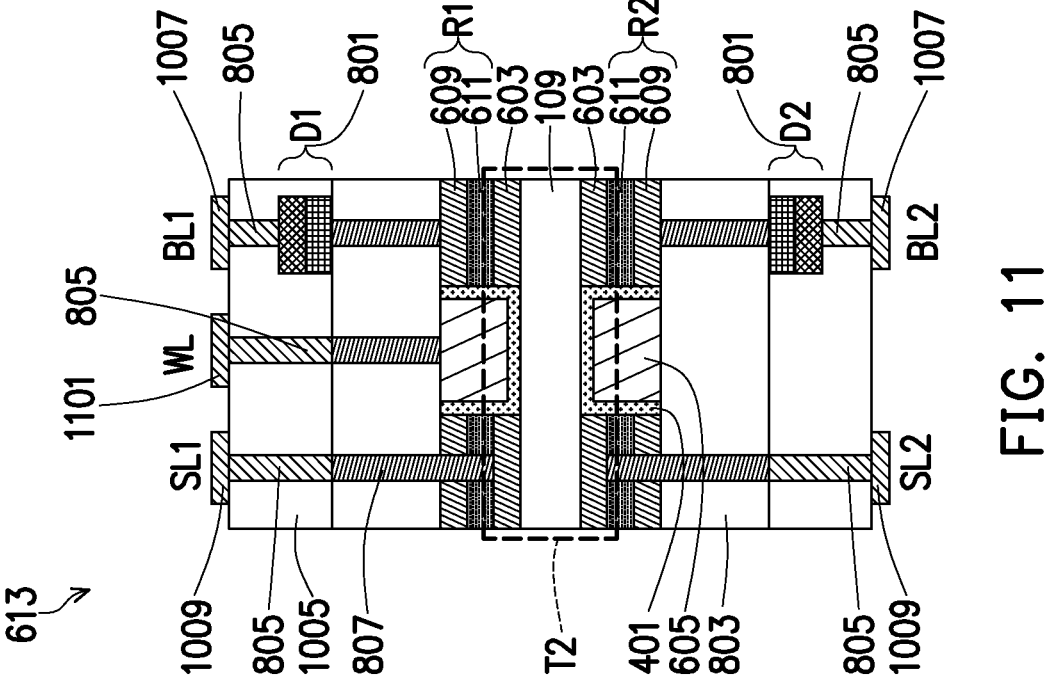
FIG. 11 is a two dimensional illustration representing several cross-sectionals views of a stacked memory cell and the first staircase contact structure of the 3D memory device, according to some embodiments.

Turning now to FIG. 11, this figure is a two dimensional illustration of the second stacked memory cell 613 (e.g., 1T2R) in the second 3D stacked memory array 600 and the adjacent staircase contact structure 800, according to some embodiments. Although the components of the second stacked memory cell 613 are illustrated in the two dimensional illustration, it should be understood that the first source line SL1, the second source line SL2, the word line WL, first bit line BL1, and the second bit line BL2 may reside in different cross-sections through the second 3D memory device 850 of FIG. 8.

Continuing with FIG. 11, in such embodiments of the second stacked memory cell 613, the diodes 801 are formed adjacent the first IMD layer 803 at an end of the conductive TIVs 807 opposite the top electrodes 609. The diodes 801 are embedded within the second IMD layer 1005 and the conductive contacts 805 are electrically coupled to the diodes 801 for external bit line connection (e.g., BL1, BL2) to the second stacked memory cell. According to some embodiments, the diodes 801 are formed as p-n type diodes with the p-type material of the diodes 801 facing the conductive TIVs 807 and the n-type material facing the conductive contacts 805. In other embodiments, the diodes 801 may be formed with an opposite orientation such that the n-type material of the diodes 801 faces the conductive TIVs 807 and the p-type material faces the conductive contacts 805. The word lines 1101 electrically couple to the wrap-around gate 605 which provides shared access via the channel layer 109 between the first source line SL1 and the second source line SL2 and the first resistor R1 and the second resistor R2, respectively.

Figure 12:
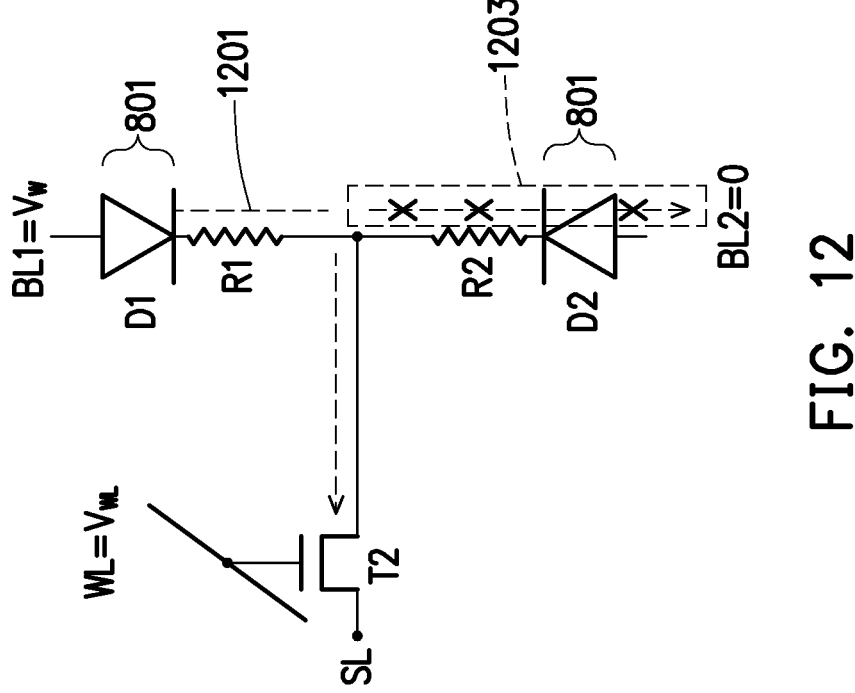
FIG. 12 is a circuit diagram of the equivalent circuit for the stacked memory cell, according to some embodiments.

FIG. 12 is a circuit diagram of a memory circuit 1200 that is equivalent to the second stacked memory cell 613 (e.g., 1T2R) illustrated in FIG. 11, according to some embodiments. FIG. 12 further illustrates a current flow 1201 through the memory circuit 1200 during a write operation to the first resistor R1, according to some embodiments. During the write operation, a write voltage $V_W$ may be placed on the first bit line BL1 of the memory circuit 1200, a reference voltage (e.g., ground (0V)) may be placed on the second bit line BL2, and a word line voltage V $W_L$ is placed on the word line WL to activate the second transistor T2. As such, the current flow 1201 passes through the second transistor T2 towards the source line SL which sets a resistance of the first resistor R1 according to the write voltage $V_W$ placed on the first bit line BL1. FIG. 12 further illustrates that, due to the write voltage $V_W$ being reverse biased for the second diode D2, leakage current 1203 is prevented from passing through the second bit line BL2. As such, write disturb conditions are avoided for the second resistor R2 during write operations to the first resistor R1 which provides for highly robust memory cells of the second 3D memory device 850.

During a write operation to the second resistor R2, the write voltage $V_W$ is placed on the second bit line BL2 and the reference voltage (e.g., 0V) is placed on the first bit line BL1. In response to the word line voltage V $W_L$ being placed on the word line WL to activate the second transistor T2, the current flow 1201 is sent through the second transistor T2 towards the source line SL which sets a resistance of the second resistor R2 according to the write voltage $V_W$. Due to the write voltage $V_W$ being reverse biased for the first diode D1, leakage current 1203 is prevented from passing through the first bit line BL1 during write operations to the second resistor R2. As such, write disturb conditions for the first resistor R1 are also avoided during write operations to the second resistor R2 which provides for highly robust memory cells for the second 3D memory device 850.

Figure 13:
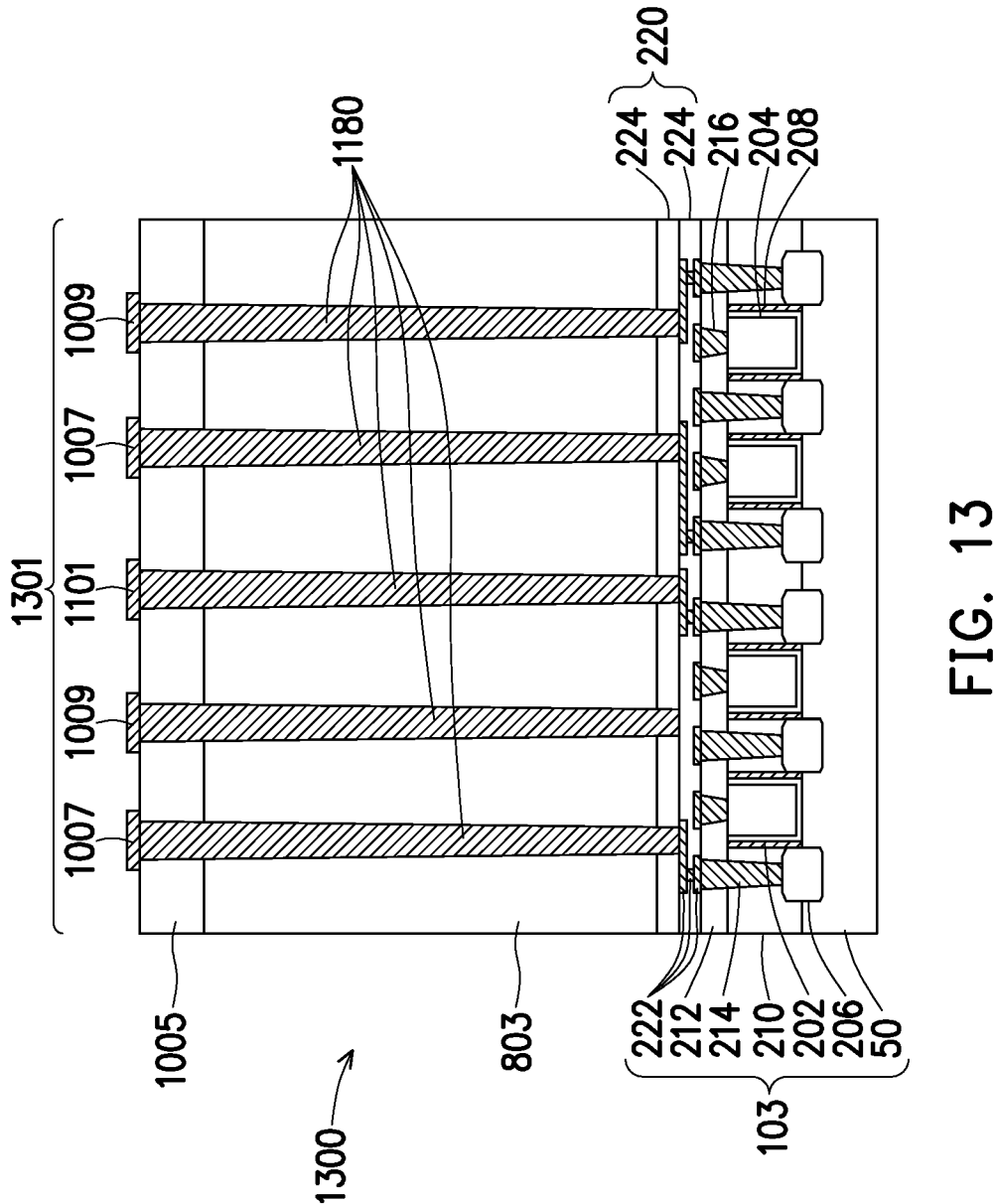
FIG. 13 illustrates a cross-sectional view of an interconnect structure, according to some embodiments.

FIG. 13 illustrates a cross-sectional view of an interconnect structure 1300 comprising conductive vias 1180 for electrically coupling one or more of the bit lines 1007, source lines 1009, and/or word lines 1101 of the second 3D memory device 850 to a first device region 1301 of the device structure 103, according to some embodiments. In some embodiments, the first device region 1301 is adjacent to the staircase contact structure 800 and comprises active devices and/or signal, power, and ground lines of a first functional semiconductor die. The first device region 1301 may comprise embedded logic devices such as central processing units (CPU), signal processors, input/output ports, system memory, and/or secondary storage devices.

According to some embodiments, the device structure 103 comprises a substrate 50 such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 13 further illustrates circuits that may be formed over the substrate 50 to form circuits embedded within the device structure 103. The circuits include active devices (e.g., transistors) at a top surface of the substrate 50. The transistors may include gate dielectric layers 202 over top surfaces of the substrate 50 and gate electrodes 204 over the gate dielectric layers 202. Source/drain regions 206 are disposed in the substrate 50 on opposite sides of the gate dielectric layers 202 and the gate electrodes 204. Gate spacers 208 are formed along sidewalls of the gate dielectric layers 202 and separate the source/drain regions 206 from the gate electrodes 204 by appropriate lateral distances. In some embodiments, the transistors may be planar field effect transistors (FETs), fin field effect transistors (finFETs), nano-field effect transistors (nanoFETs), or the like.

A first ILD layer 210 surrounds and isolates the source/drain regions 206, the gate dielectric layers 202, and the gate electrodes 204 and a second ILD layer 212 is over the first ILD layer 210. Source/drain contacts 214 extend through the second ILD layer 212 and the first ILD layer 210 and are electrically coupled to the source/drain regions 206 and gate contacts 216 extend through the second ILD layer 212 and are electrically coupled to the gate electrodes 204. An interconnect structure 220, including one or more stacked dielectric layers 224 and conductive features 222 formed in the one or more stacked dielectric layers 224, is over the second ILD layer 212, the source/drain contacts 214, and the gate contacts 216. Although FIG. 12 illustrates two of the stacked dielectric layers 224, it should be appreciated that the interconnect structure 220 may include any number of stacked dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 12 discusses transistors formed over the substrate 50, other active devices (e.g., diodes or the like) and/or passive devices (e.g., capacitors, resistors, or the like) may also be formed as part of the functional circuits.

The interconnect structure 1300 is formed over the device structure 103 by initially forming the first IMD layer 803 over the device structure 103 and the second IMD layer 1005 over the first IMD layer 803, as discussed above. Once the first IMD layer 803, the second IMD layer 1005, and (if provided) a topmost dielectric layer of the interconnect structure 220 have been formed, suitable photolithographic and etching processes may be used to form openings through these ILD layers in desired locations of the conductive vias 1180. As such, contact areas of conductive features 222 are exposed through the openings.

For example, the conductive vias 1180 may extend through the second IMD layer 1005, the first IMD layer 803, and/or stacked dielectric layers 224 to electrically connect the bit lines 1007, the source lines 1009, and/or the word lines 1101 to the underlying circuitry of the interconnect structure 220 and the active devices on the substrate 50. In some embodiments, routing and/or power lines to and from the memory array may be provided by an interconnect structure formed over the second 3D stacked memory array 600 in addition to or in lieu of the interconnect structure 220. Accordingly, the second 3D memory device 850 may be completed.

In an embodiment in which the conductive contacts 805 are conductive pillars (e.g., tungsten, copper, aluminum, titanium, alloys, combinations thereof, or the like), the conductive contacts 805 may be formed by initially forming the first IMD layer 803 over the first region 115 and the second region 117 of the second multilayer stack 101. Once formed, the first IMD layer 803 is patterned using suitable photolithographic and etching processes to form openings through the interlayer dielectric layer and expose areas of the word lines 1101 and/or the staircase contact areas 905 in desired locations of the conductive contacts 805. Once the openings have been formed, the openings may be filled and/or overfilled with a conductive fill material (e.g., W, Al, Cu, or the like) using a suitable deposition process (e.g., chemical vapor deposition (CVD), physical vapor deposition (PVD), or the like). Once the conductive contacts 805 have been deposited, a planarization process may be performed to planarize the top surfaces of the conductive contacts 805 to be co-planar with a surface of the interlayer dielectric layer. Once the conductive contacts 805 have been formed, the interlayer dielectric layer (not shown) may remain to allow for further processing of the second 3D stacked memory array 600, according to some embodiments.

Figure 14A:
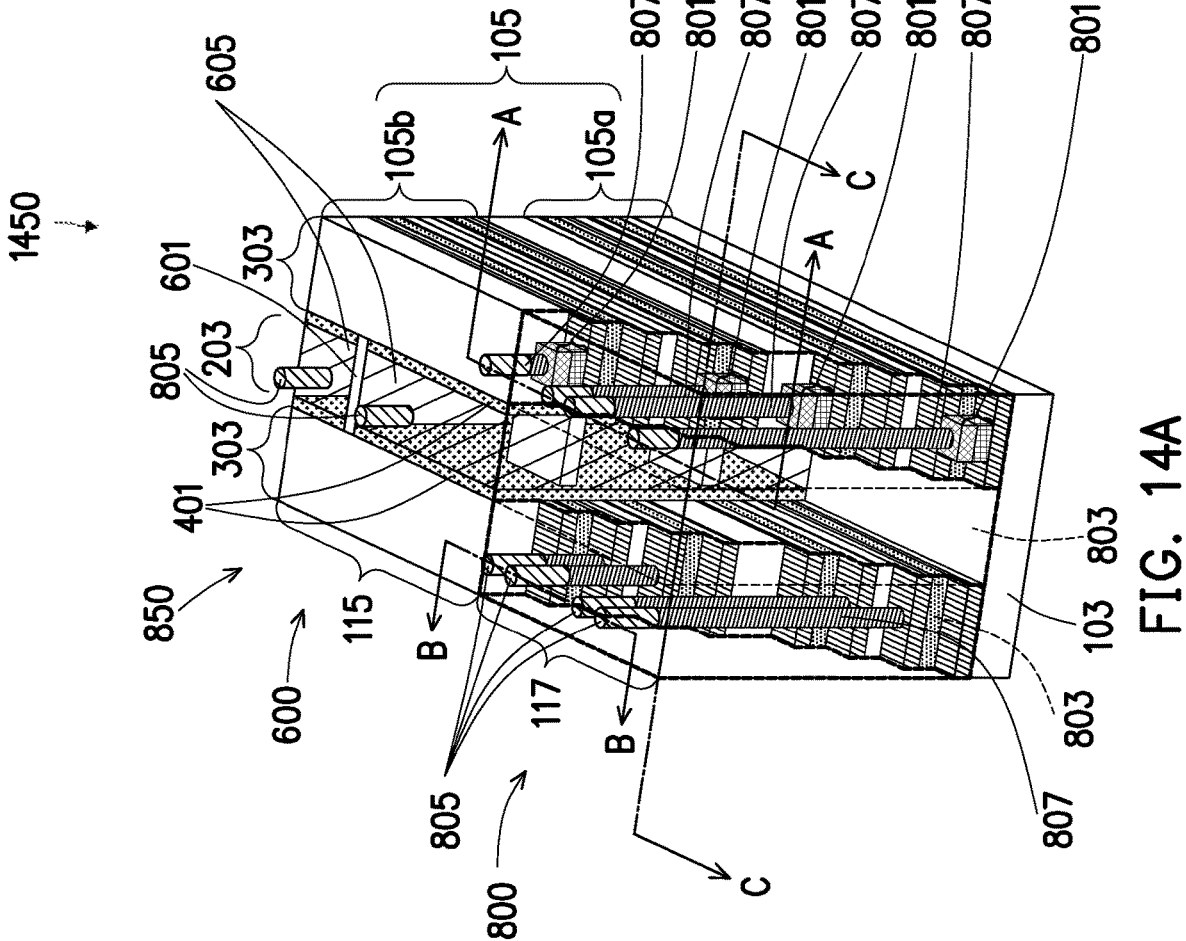
FIG. 14A illustrates a perspective view of a second 3D memory device incorporating the 3D stackable RRAM array and a second staircase contact structure, in accordance with some other embodiments.

Turning now to FIG. 14A, this figure illustrates a third 3D memory device 1450 according to some other embodiments. The third 3D memory device 1450 is similar to the second 3D memory device 850 (shown in FIG. 8) except the diodes 801 are formed adjacent the top electrodes 609 of the first resistors R1 and the second resistors R2 instead of being formed over the first IMD layer 803. According to some embodiments, the third 3D memory device 1450 may be formed using an inter-metal dielectric (IMD) layer last process.

Figure 14B:
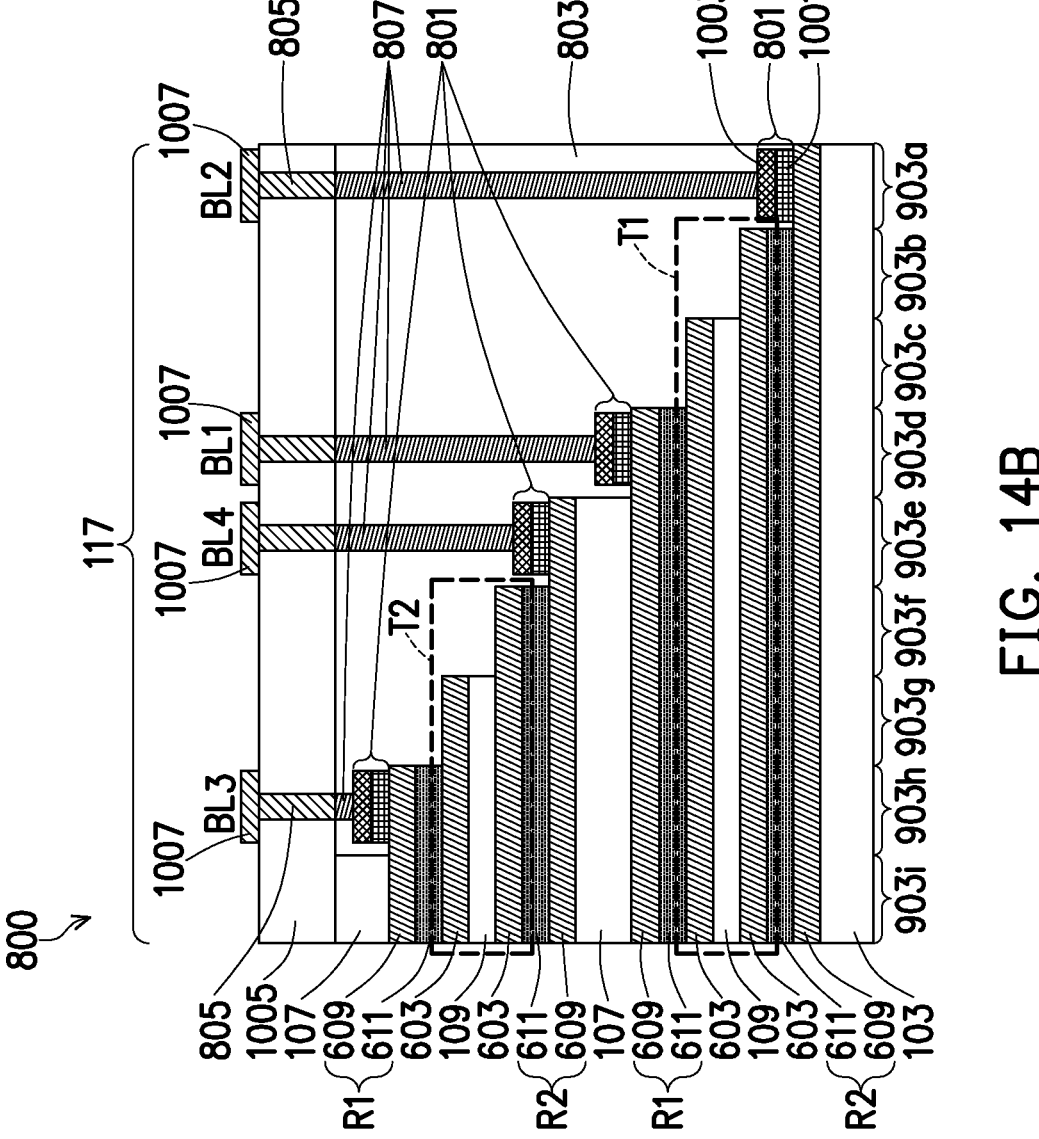
FIG. 14B illustrates a cross-sectional view of the staircase contact structure, in accordance with some embodiments.

FIG. 14B illustrates the cross-sectional view of the cutline A-A through the staircase contact structure 800 of FIG. 14A. FIG. 14B is similar to FIG. 10A except the diodes 801 are disposed adjacent the top electrodes 609 instead of over the first IMD layer 803 and the conductive TIVs 807 over the diodes 801. The staircase contact structure 800 can be formed using the materials and processes set forth above with regard to FIG. 9. Once the staircase contact structure 800 has been formed, the diodes 801 may be formed by initially placing a mask (e.g., photoresist) over the first region 115 and the second region 117 of the third 3D memory device 1450, in accordance with some embodiments. The mask (not shown) may be formed and patterned using any of the materials and processes used to form the photoresist 901 described above. Once formed, the mask is patterned to form openings through the mask in desired locations of the diodes 801 such that the top electrodes 609 are exposed through the openings in the mask.

Once the openings have been formed, the first conductive type oxide semiconductor layers 1001 are deposited within the openings and over the top electrodes 609 using a selective growth process. According to some embodiments, the selective growth process may be a bottom-up process that is used to form the first conductive type oxide semiconductor layers 1001 at the bottom of the openings without substantially forming along sidewalls of the openings. The selective growth process may be a timed process such that the first conductive type oxide semiconductor layers 1001 is formed to a desired thickness over the top electrodes 609.

Furthermore, the first conductive type oxide semiconductor layers 1001 may 1001 may be formed using any of the materials suitable for forming the bulk layer of the first conductive type oxide semiconductor layer 1001 described above. The first conductive type oxide semiconductor layer 1001 may be doped using any of the doping processes set forth above (e.g., in situ during epitaxial growth) to have a first conductive type (e.g., p-type). However, any suitable materials, deposition processes, and/or doping processes may be utilized to form the first conductive type oxide semiconductor layer 1001. According to some embodiments, the first conductive type oxide semiconductor layer 1001 may be planarized and/or thickness reduced to a desired height using, e.g., an optional etching process. As such, the first conductive type oxide semiconductor layer 1001 is formed over and electrically coupled to the top electrodes 609 of the bit line portion of the staircase contact structure 800.

The second conductive type oxide semiconductor layers 1003 may be formed within the openings to a desired thickness over the first conductive type oxide semiconductor layers 1001 using a selective growth process. According to some embodiments, the selective growth process may be a bottom-up process that is used to form the second conductive type oxide semiconductor layers 1003 at the bottom of the openings over the first conductive type oxide semiconductor layers 1001 without substantially forming along sidewalls of the openings. The selective growth process may be a timed process such that the second conductive type oxide semiconductor layers 1003 is formed to a desired thickness over the first conductive type oxide semiconductor layers 1001.

Furthermore, the second conductive type oxide semiconductor layers 1003 may be formed using any of the materials suitable for forming the bulk layer of the second conductive type oxide semiconductor layer 1003 described above. The second conductive type oxide semiconductor layer 1003 may be doped using any of the doping processes set forth above (e.g., in situ during epitaxial growth) to have a second conductive type (e.g., n-type) that is counter-doped to the first conductive type (e.g., p-type). However, any suitable materials, deposition processes, and/or doping processes may be utilized to form the second conductive type oxide semiconductor layer 1003. In some embodiments, the second conductive type oxide semiconductor layer 1003 may be planarized and/or thickness reduced to a desired height using, e.g., an optional etching process. As such, the diodes 801 comprising the first conductive type oxide semiconductor layer 1001 and the second conductive type oxide semiconductor layer 1003 are formed over and electrically coupled to the top electrodes 609 in the bit line portion of the staircase contact structure 800. Once the diodes 801 have been formed, the mask may be removed using a suitable removal process (e.g., ashing).

With the mask removed, the diodes 801 and surfaces of the staircase contact structure 800 not covered by the diodes 801 are exposed. As such, the first IMD layer 803 may be formed over the staircase contact structure 800 and the diodes 801 using any of the suitable materials and processes set forth above. Furthermore, the conductive TIVs 807 may be formed through the first IMD layer 803 to the diodes 801 by initially forming openings through the first IMD layer 803. Once the openings have been formed through the first IMD layer 803, the diodes 801 are exposed at the bottoms of the openings. The conductive TIVs 807 are then formed to the diodes 801 using any of the materials and processes set forth above. Once formed, the conductive TIVs 807 are planarized with the surface of the first IMD layer 803.

Furthermore, the second IMD layer 1005 is formed over the planar surfaces of the first IMD layer 803 and/or the isolation layers 107 and the conductive contacts 805 are formed though the second IMD layer 1005 down to the conductive TIVs 807, as described above. In addition, the conductive TIVs 807 are formed through the first IMD layer 803 to the metal source/bit lines 603 and the conductive contacts 805 are formed over the conductive TIVs 807 in the source line structure portion of the staircase contact structure 800, as described above. Furthermore, the conductive contacts 805 are formed over the wrap-around gates 605 of the second 3D stacked memory array 600, as described above.

Once the conductive contacts 805 have been formed, the bit lines 1007 are formed over the conductive contacts 805 for external connection to the diodes 801 in the staircase contact structure 800. Furthermore, the source lines 1009 are formed over the conductive contacts 805 for external connection to the metal source/bit lines 603 in the staircase contact structure 800. Further still, the word lines 1101 are formed over the conductive contacts 805 for external connection to the wrap-around gates 605 of the second 3D stacked memory array 600, as described above. According to some embodiments, the bit lines 1007, the source lines 1009, and the word lines 1101 electrically couple the third 3D memory device 1450 to the interconnect structure 1300 in the first device region 1301. As described above, the interconnect structure 1300 electrically couples one or more of the bit lines 1007, source lines 1009, and/or word lines 1101 to one or more active devices and/or signal, power, and ground lines of the first functional semiconductor die (e.g., embedded logic devices, central processing units (CPU), signal processors, input/output ports, system memory, and/or secondary storage devices).

Figure 15:
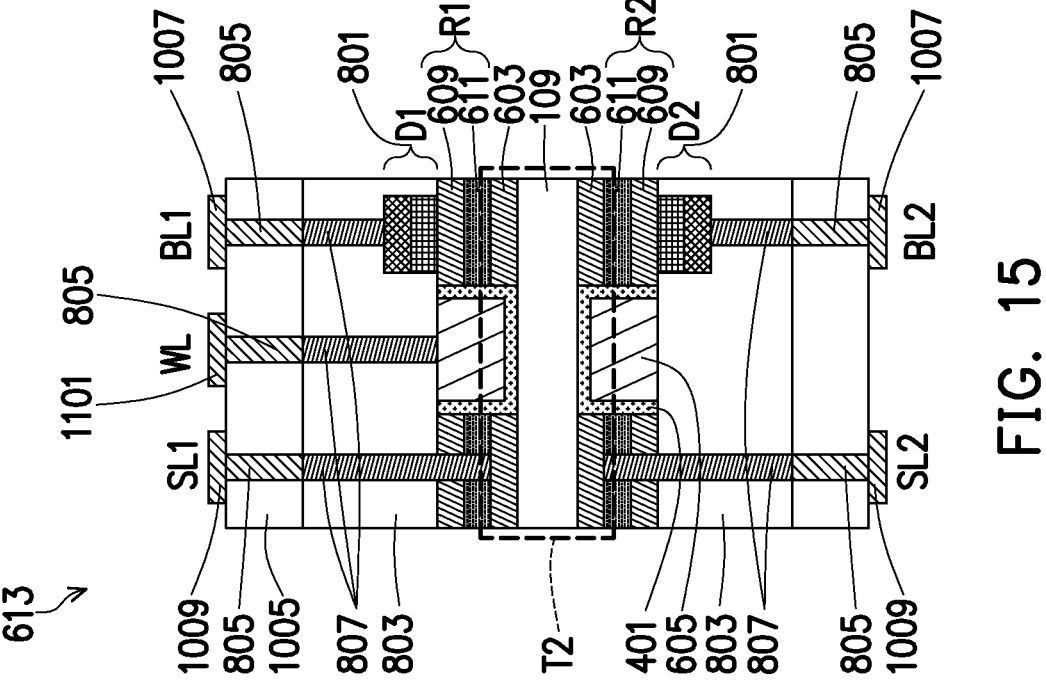
FIG. 15 is a two dimensional illustration representing several cross-sectionals views of a stacked memory cell and the second staircase contact structure of the second 3D memory device, according to some embodiments.

Turning now to FIG. 15, this figure is a two dimensional illustration of the second stacked memory cell 613 (e.g., 1T2R) in the third 3D memory device 1450 and the adjacent staircase contact structure 800, according to some embodiments. Although the components of the second stacked memory cell 613 are illustrated in the two dimensional illustration, it should be understood that the first source line SL1, the second source line SL2, the word line WL, first bit line BL1, and the second bit line BL2 may reside in different cross-sections through the third 3D memory device 1450 of FIG. 14A.

Continuing with FIG. 15, this figure is similar to FIG. 11 except the diodes 801 are formed adjacent the top electrodes 609 instead of on top of the first IMD layer 803 and the conductive TIVs 807 are formed over the diodes 801. The diodes 801 are embedded within the second IMD layer 1005 and the conductive contacts 805 are electrically coupled to the conductive TIVs 807 for external bit line connection (e.g., BL1, BL2) to the second stacked memory cell. According to some embodiments, the diodes 801 are formed as p-n type diodes with the p-type material of the diodes 801 facing the top electrodes 609 and the n-type material facing the conductive TIVs 807. In other embodiments, the diodes 801 may be formed with an opposite orientation such that the n-type material of the diodes 801 faces the top electrodes 609 and the p-type material of the diodes 801 faces the conductive TIVs 807. The word lines 1101 electrically couple to the wrap-around gate 605 which provides shared access via the channel layer 109 between the first source line SL1 and the second source line SL2 and the first resistor R1 and the second resistor R2, respectively.

Figure 16:
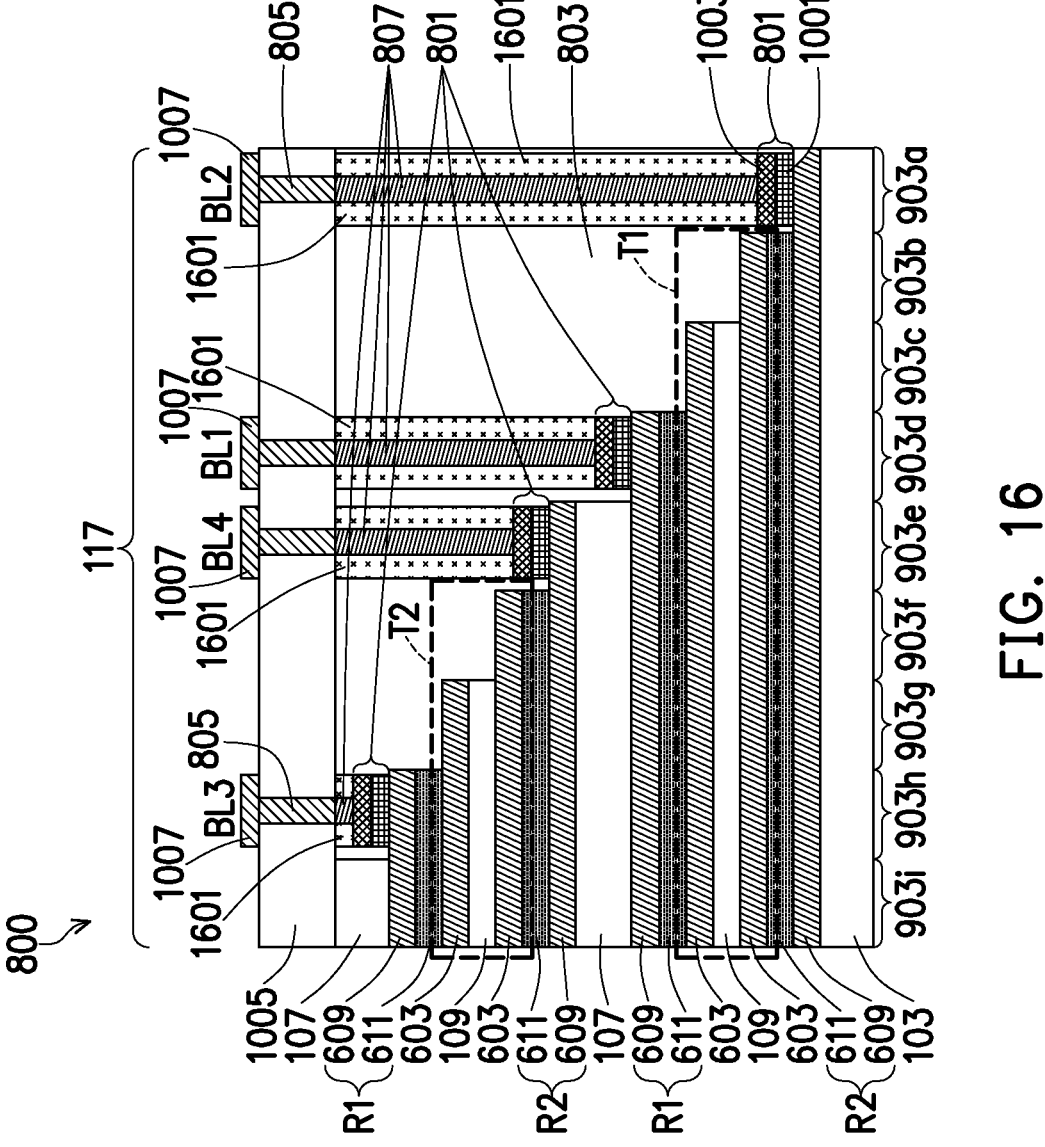
FIG. 16 illustrates a cross-sectional view of the staircase contact structure, in accordance with some other embodiments.

Turning now to FIG. 16, this figure illustrates a cross-sectional view of the cutline A-A through the staircase contact structure 800 of the third 3D memory device 1450 formed using an IMD layer first process, according to some other embodiments. The formation of the staircase contact structure 800 illustrated in FIG. 16 is similar to the formation of the staircase contact structure 800 illustrated in FIG. 14B except the first IMD layer 803 is formed prior to the formation of the diodes 801 over the top electrodes 609.

According to some embodiments, the staircase contact structure 800 can be formed using the materials and processes set forth above with regard to FIG. 9. Once the staircase contact structure 800 has been formed, the first IMD layer 803 may be formed over the staircase contact structure 800 using any of the suitable materials and processes set forth above. The diodes 801 may be formed by initially placing the mask (e.g., photoresist) over the first region 115 and the second region 117 of the third 3D memory device 1450 as described above. The mask (not shown) may be formed and patterned using any of the materials and processes used to form the photoresist 901 described above. Once formed, the mask is patterned to form openings through the mask in desired locations of the diodes 801 such that the first IMD layer 803 is exposed through the openings in the mask. The mask is then used to form openings through the first IMD layer 803 exposing the top electrodes 609 at the bottoms of the openings.

Once the top electrodes 609 are exposed at the bottoms of the openings, the diodes 801 may be formed at the bottoms of the openings by depositing the first conductive type oxide semiconductor layers 1001 and the second conductive type oxide semiconductor layers 1003 within the openings and over the top electrodes 609. The first conductive type oxide semiconductor layers 1001 and the second conductive type oxide semiconductor layers 1003 may be formed at the bottom of the openings using the selective growth processes (e.g., the bottom-up deposition) without substantially forming along sidewalls of the openings. The selective growth process may also be a timed process such that the first conductive type oxide semiconductor layers 1001 and the second conductive type oxide semiconductor layers 1003 are formed over the top electrodes 609 to desired thicknesses of the diodes 801. Furthermore, each of the first conductive type oxide semiconductor layers 1001 and the second conductive type oxide semiconductor layers 1003 are counter-doped (e.g., in situ during epitaxial growth) as discussed above. For example, the first conductive type oxide semiconductor layers 1001 may be doped a first conductive type (e.g., p-type) and the second conductive type oxide semiconductor layers 1003 may be doped a second conductive type (e.g., n-type).

Once the diodes 801 have been formed, a dielectric fill material 1601 is deposited over the diodes 801 to fill and/or overfill the openings. The dielectric fill material 1601 may be formed using any of the materials and processes suitable for forming the first IMD layer 803. According to some embodiments, the material used to form the dielectric fill material 1601 is the same material used to form the first IMD layer 803. In other embodiments, the material used to form the dielectric fill material 1601 is different from the material used to form the first IMD layer 803. Once formed, the dielectric fill material 1601 may be planarized (e.g., CMP) with the second IMD layer 1005 to remove any excess dielectric fill material 1601 outside of the openings.

The conductive TIVs 807 may be formed by initially forming openings through the dielectric fill material 1601 exposing the diodes 801 at the bottoms of the openings. The openings may be formed through the dielectric fill material 1601 using any of the materials and processes suitable for forming openings for the conductive TIVs 807 in the first IMD layer 803 as set forth above.

Once the openings have been formed through the dielectric fill material 1601, the conductive TIVs 807 are then formed to the diodes 801 using any of the materials and processes set forth above. Once formed, the conductive TIVs 807 are planarized with the surface of the first IMD layer 803 and the dielectric fill material 1601. Furthermore, the second IMD layer 1005 may be formed as described above. The conductive contacts 805 may be formed through the second IMD layer 1005 and electrically connect to the conductive TIVs 807 as described above. According to some embodiments, the bit lines 1007 are formed to the conductive contacts 805 and electrically couple one or more of the diodes to the interconnect structure 1300 in the first device region 1301.

Furthermore, the conductive TIVs 807 may be formed in the source line structure portion of the staircase contact structure 800 by initially forming openings through the first IMD layer 803 exposing the metal source/bit lines 603 through the openings. Once formed, the conductive TIVs 807, the second IMD layer 1005, the conductive contacts 805, the source lines 1009, and word lines 1101 may be formed as described above.

Figure 17:
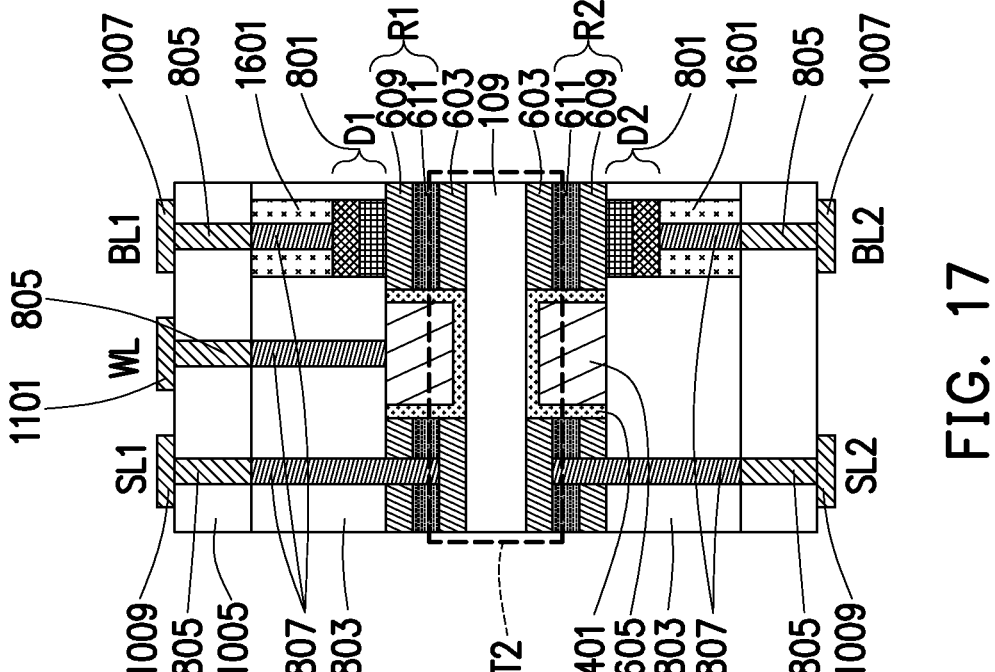
FIG. 17 is a two dimensional illustration representing several cross-sectionals views of a stacked memory cell and the staircase contact structure of the second 3D memory device, according to some other embodiments.

With reference now to FIG. 17, this figure is a two dimensional illustration of the second stacked memory cell 613 (e.g., 1T2R) in the third 3D memory device 1450 and the adjacent staircase contact structure 800, according to some embodiments. Although the components of the second stacked memory cell 613 are illustrated in the two dimensional illustration, it should be understood that the first source line SL1, the second source line SL2, the word line WL, first bit line BL1, and the second bit line BL2 may reside in different cross-sections through the third 3D memory device 1450 of FIG. 14A.

Continuing with FIG. 17, this figure is similar to FIG. 15 except the dielectric fill material 1601 surrounds the conductive TIVs 807 disposed over the diodes 801. The diodes 801, the dielectric fill material 1601, and the remaining conductive TIVs 807 are embedded within the second IMD layer 1005 and the conductive contacts 805 are electrically coupled to the conductive TIVs 807 for external bit line connection (e.g., BL1, BL2) to the second stacked memory cell 613. According to some embodiments, the diodes 801 are formed as p-n type diodes with the p-type material of the diodes 801 facing the top electrodes 609 and the n-type material facing the conductive TIVs 807. In other embodiments, the diodes 801 may be formed with an opposite orientation such that the n-type material of the diodes 801 faces the top electrodes 609 and the p-type material face the conductive TIVs 807. The word lines 1101 electrically couple to the wrap-around gate 605 which provides shared access via the channel layer 109 between the first source line SL1 and the first resistor R1 and between the second source line SL2 and the second resistor R2.

The embodiments of the present disclosure have some advantageous features. Forming a 3-dimensional (3D) memory array (e.g., a RRAM memory array) that comprises a plurality of stacked memory cells (e.g., 1T2R memory cell) and that includes forming a first diode over a first resistor of the memory cell and a second diode over a second resistor of the memory cell. As such, the first diode and the second diode may be referred to herein as BEOL-compatible diodes. In addition, the source line and the bit line corresponding to each memory cell are formed in the same layer which allows for a reduction in the height and the aspect ratio of the multi-layer stack that is used in the fabrication process. The resulting 3D memory array may also have a reduced height and/or an increasing device density. As such, the memory density of the resulting 3D memory array may be double the memory density of a memory array of the same chip size. Further, embodiments of the present disclosure provide for a memory cell (e.g., 1T2R) that prevents write disturb issues during write operations to a targeted resistor of the memory cell. For example, during write operations to a targeted resistor of the memory cell, leakage currents are prevented from passing through the bit line of the non-targeted resistor of the memory cell due to the reverse bias of the diode attached to the non-targeted resistor.

According to an embodiment, a memory device includes: a resistive memory array including a first resistive memory cell; a staircase contact structure adjacent the resistive memory array; an inter-metal dielectric layer over the staircase contact structure; a first diode and a second diode over the inter-metal dielectric layer; a first conductive via electrically coupling the first diode to a first resistor of the first resistive memory cell; and a second conductive via electrically coupling the second diode to a second resistor of the first resistive memory cell. In an embodiment of the memory device, the first conductive via is connected to a first top electrode of the first resistor and the second conductive via is connected to a second top electrode of the second resistor. In an embodiment of the memory device, a first bit line is electrically coupled to the first resistor and a second bit line is electrically coupled to the second resistor, wherein the first bit line and the second bit line are at least partially disposed in the first resistive memory cell. In an embodiment of the memory device, the first bit line is connected to a first resistive memory film of the first resistor and the second bit line is connected to a second resistive memory film of the second resistor. In an embodiment of the memory device, the first resistive memory cell includes a first transistor and the memory device further includes: a third conductive via connected to a first source line that is electrically coupled to the first transistor; and a fourth conductive via connected to a second source line that is electrically coupled to the first transistor. In an embodiment of the memory device, the first transistor includes a gate dielectric surrounding a channel region of the first transistor and a wrap-around gate, wherein the channel region of the first transistor separates the first source line from the second source line and separates the first bit line from the second bit line. In an embodiment, the memory device further includes: a second resistive memory cell over the first resistive memory cell; a third diode and a fourth diode over the inter-metal dielectric layer; a fifth conductive via electrically coupling the third diode to a third resistor of the second resistive memory cell; and a sixth conductive via electrically coupling the fourth diode to a fourth resistor of the second resistive memory cell.

In another embodiment, a memory device includes: a first memory cell including a first transistor, a first resistor, and a second resistor, wherein the first resistor is coupled to a first bit line and the second resistor is coupled to a second bit line; a first diode connected to a first electrode of the first resistor; a second diode connected to a second electrode of the second resistor, the first electrode of the first resistor being over the second electrode of the second resistor; a first conductive via connected to the first diode; a second conductive via connected to the second diode; and an inter-metal dielectric layer, wherein the first diode, the second diode, the first conductive via, and the second conductive via are embedded in the inter-metal dielectric layer. In an embodiment of the memory device, the first diode includes a first conductive type semiconductor oxide layer adjacent the first electrode of the first resistor. In an embodiment of the memory device, the first diode includes a second conductive type semiconductor oxide layer adjacent the first conductive type semiconductor oxide layer. In an embodiment of the memory device, the first conductive type semiconductor oxide layer is a p-type and the second conductive type semiconductor oxide layer is an n-type. In an embodiment, the memory device further includes: a third conductive via connected to a first source line; and a fourth conductive via connected to a second source line, the third conductive via and the fourth conductive via being embedded in the inter-metal dielectric layer. In an embodiment of the memory device, the first transistor includes a wrap-around gate surrounding a first channel region of the first transistor. In an embodiment, the memory device further includes: a second memory cell over the first memory cell, the second memory cell including a second transistor, a third resistor, and a fourth resistor, wherein the third resistor is coupled to a third bit line and the fourth resistor is coupled to a fourth bit line; a third diode connected to a third electrode of the third resistor; a fourth diode connected to a fourth electrode of the fourth resistor, the third electrode of the third resistor being over the fourth electrode of the fourth resistor; a fifth conductive via connected to the third diode; and a sixth conductive via connected to the fourth diode, wherein the third diode, the fourth diode, the fifth conductive via, and the sixth conductive via are embedded in the inter-metal dielectric layer. In an embodiment of the memory device, the wrap-around gate surrounds a second channel region of the second transistor.

In yet another embodiment, a method includes: forming a resistive memory array in a first region of a multilayer stack of materials, the resistive memory array including a first memory cell; exposing a first resistor and a second resistor of the first memory cell by forming a staircase contact structure adjacent the resistive memory array; forming a first diode over the staircase contact structure, the first diode being electrically coupled to the first resistor; and forming a second diode over the staircase contact structure, the second diode being electrically coupled to the second resistor. In an embodiment, the method further includes: forming an inter-metal dielectric layer over the staircase contact structure; forming a first contact via through the inter-metal dielectric layer to the first resistor; and forming a second contact via through the inter-metal dielectric layer to the second resistor, wherein forming the first diode and the second diode includes: depositing a first conductive type semiconductor oxide layer over the inter-metal dielectric layer; depositing a second conductive type semiconductor oxide layer over the first conductive type semiconductor oxide layer; and forming the first diode connected to the first contact via and forming the second diode connected to the second contact via by patterning the first and second conductive type semiconductor oxide layers. In an embodiment of the method, forming the first diode includes forming the first diode in direct contact with the first resistor, forming the second diode includes forming the second diode in direct contact with the second resistor, and wherein the method further includes: forming an inter-metal dielectric layer over the first diode, the second diode, and the staircase contact structure; forming a first contact via through the inter-metal dielectric layer to the first diode; and forming a second contact via through the inter-metal dielectric layer to the second diode. In an embodiment, the method further includes: forming an inter-metal dielectric layer over the staircase contact structure; exposing the first resistor and the second resistor by forming openings in the inter-metal dielectric layer; forming diodes by depositing a first conductive type semiconductor oxide material over the first resistor and the second resistor at bottoms of the openings and depositing a second conductive type semiconductor oxide material over the first conductive type semiconductor oxide material at the bottoms of the openings; filling the openings with a dielectric material; and forming a conductive via through the dielectric material to each of the diodes. In an embodiment of the method, forming the first conductive type semiconductor oxide material includes using a p-type dopant and wherein forming the second conductive type semiconductor oxide material includes using an n-type dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a resistive memory structure comprising a first resistive layer and a second resistive layer;
a first dielectric layer over the first resistive layer and the second resistive layer;
a first diode and a second diode over the first dielectric layer;
a first conductive via electrically coupling the first diode to the first resistive layer; and
a second conductive via electrically coupling the second diode to the second resistive layer.

2. The memory device of claim 1, wherein the resistive memory structure further comprises:
a channel layer between the first resistive layer and the second resistive layer;
a first conductive layer between the first resistive layer and the channel layer; and
a second conductive layer between the second resistive layer and the channel layer;
a first stack and a second stack, each of the first stack and the second stack comprising the first resistive layer, the second resistive layer, the first conductive layer, the second conductive layer, and the channel layer, the channel layer extending from the first stack to the second stack; and
a gate structure on the channel layer between the first stack and the second stack.

3. The memory device of claim 2, wherein the first diode and the second diode are over the second stack.

4. The memory device of claim 2, wherein the first stack has a first staircase structure, wherein the second stack has a second staircase structure different than the first staircase structure.

5. The memory device of claim 2, wherein the channel layer is a thin-film oxide semiconductor material.

6. The memory device of claim 2, wherein the channel layer comprises zinc oxide, indium gallium zinc oxide, indium tin oxide, or indium tungsten oxide.

7. The memory device of claim 1, wherein the first diode is coupled to a first bit line, wherein the second diode is coupled to a second bit line.

8. A memory device comprising:
a first memory structure comprising a gate electrode, a channel layer, a first resistor layer, and a second resistor layer, the gate electrode extending around a channel region of the channel layer, the channel region of the channel layer being between a first portion of the channel layer and a second portion of the channel layer, wherein the second portion of the channel layer is over the second resistor layer, wherein the first resistor layer is over the second portion of the channel layer, wherein the first resistor layer and the second resistor layer electrically are coupled to the second portion of the channel layer;
a first diode electrically connected to a first electrode of the first resistor layer, wherein the first diode is coupled to a first bit line;
a second diode electrically connected to a first electrode of the second resistor layer, wherein the second resistor layer is coupled to a second bit line, the first electrode of the first resistor layer being over the first electrode of the second resistor layer;
a dielectric layer over the first resistor layer and the second resistor layer;
a first conductive via extending through the dielectric layer, the first conductive via being electrically connected to the first diode; and
a second conductive via extending through the dielectric layer, the second conductive via being electrically connected to the second diode.

9. The memory device of claim 8, wherein the dielectric layer extends along sidewalls of the first diode and the second diode.

10. The memory device of claim 8, wherein the second diode comprises:
a first conductive type oxide semiconductor layer over the first electrode of the second resistor layer; and
a second conductive type oxide semiconductor layer over the first conductive type oxide semiconductor layer.

11. The memory device of claim 10, wherein the dielectric layer extends between the second diode and the second resistor layer.

12. The memory device of claim 8, further comprising:
an isolation layer over the first resistor layer, wherein the dielectric layer extends between the first resistor layer and the isolation layer.

13. The memory device of claim 8, wherein the first resistor layer, the channel layer, and the second resistor layer form a staircase pattern in a cross-sectional view.

14. The memory device of claim 8, wherein the dielectric layer contacts a top and sidewalls of the first diode and the second diode.

15. A memory device comprising:

a memory structure comprising a gate electrode, a first resistor, and a second resistor, wherein the first resistor is coupled to a first bit line and the second resistor is coupled to a second bit line;

an inter-metal dielectric layer over the first resistor and the second resistor;

a first conductive via extending through the inter-metal dielectric layer to the first resistor;

a second conductive via extending through the inter-metal dielectric layer to the second resistor;

a first diode over the inter-metal dielectric layer and connected to the first resistor by the first conductive via; and a second diode over the inter-metal dielectric layer and connected to the second resistor by the second conductive via.

16. The memory device of claim 15, wherein the memory structure further comprises a channel layer, wherein the first resistor is over the channel layer, wherein the channel layer is over the second resistor.

17. The memory device of claim 16, wherein the gate electrode wraps around the channel layer adjacent the first resistor and the second resistor.

18. The memory device of claim 16, further comprising:

a first electrode over the first resistor, the first electrode and the first resistor being coterminous, the first conductive via landing on an upper surface of the first electrode.

19. The memory device of claim 18, further comprising:

a second electrode under the second resistor, the second electrode protruding from under the second resistor, the second conductive via landing on an upper surface of the second electrode.

20. The memory device of claim 18, further comprising an isolation layer over the first electrode, wherein the inter-metal dielectric layer contacts the upper surface of the first electrode between the first conductive via and the isolation layer.

* * * * *